US010424557B2

(12) United States Patent
Sugaya et al.

(10) Patent No.: US 10,424,557 B2
(45) Date of Patent: Sep. 24, 2019

(54) SUBSTRATE BONDING APPARATUS AND SUBSTRATE BONDING METHOD

(71) Applicant: NIKON CORPORATION, Tokyo (JP)

(72) Inventors: Isao Sugaya, Tokyo (JP); Hajime Mitsuishi, Tokyo (JP); Minoru Fukuda, Tokyo (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 16/144,439

(22) Filed: Sep. 27, 2018

(65) Prior Publication Data
US 2019/0043826 A1 Feb. 7, 2019

Related U.S. Application Data

(63) Continuation of application No. PCT/JP2016/059992, filed on Mar. 28, 2016.

(51) Int. Cl.
| H01L 23/00 | (2006.01) |
| H01L 21/18 | (2006.01) |
| H01L 23/544 | (2006.01) |
| H01L 21/66 | (2006.01) |
| H01L 21/02 | (2006.01) |
(Continued)

(52) U.S. Cl.
CPC .......... *H01L 24/80* (2013.01); *H01L 21/02* (2013.01); *H01L 21/187* (2013.01); *H01L 21/2007* (2013.01); *H01L 21/67092* (2013.01); *H01L 21/67103* (2013.01); *H01L 21/67248* (2013.01); *H01L 21/68735* (2013.01); *H01L 22/12* (2013.01); *H01L 22/20* (2013.01); *H01L 23/544* (2013.01); *H01L 24/74* (2013.01); *H01L 21/68* (2013.01); *H01L 2223/54426* (2013.01);
(Continued)

(58) Field of Classification Search
CPC ....... H01L 24/80; H01L 24/74; H01L 23/544; H01L 21/68735; H01L 21/2007; H01L 21/67092; H01L 23/67103; H01L 21/67248
See application file for complete search history.

(56) References Cited

U.S. PATENT DOCUMENTS

2012/0247645 A1  10/2012  Tsutsumi et al.
2015/0231873 A1   8/2015  Okamoto et al.

FOREIGN PATENT DOCUMENTS

JP    2011-114278 A    6/2011
JP    2013-008921 A    1/2013
(Continued)

OTHER PUBLICATIONS

International Search Report dated Jun. 28, 2016 by the Japanese Patent Office in corresponding International Application No. PCT/JP2016/059992, and English translation thereof.
(Continued)

*Primary Examiner* — Seahvosh Nikmanesh
(74) *Attorney, Agent, or Firm* — Finnegan, Henderson, Farabow, Garett & Dunner, LLP

(57) ABSTRACT

A substrate bonding apparatus that brings a part of a surface of a first substrate and a part of a surface of a second substrate into contact to form contact regions at the parts, and then enlarges the contact regions to bond the first substrate and the second substrate includes: a temperature adjusting unit that adjusts a temperature of at least one of the first substrate and the second substrate such that positional misalignment between the first substrate and the second substrate does not exceed a threshold at least in a course of enlargement of the contact regions.

16 Claims, 27 Drawing Sheets

(51) Int. Cl.
  *H01L 21/20* (2006.01)
  *H01L 21/67* (2006.01)
  *H01L 21/687* (2006.01)
  *H01L 21/68* (2006.01)
(52) U.S. Cl.
  CPC ............... *H01L 2224/8013* (2013.01); *H01L 2224/80095* (2013.01); *H01L 2224/80895* (2013.01)

(56) References Cited

FOREIGN PATENT DOCUMENTS

| | | |
|---|---|---|
| JP | 2013-258377 A | 12/2013 |
| JP | 2014-011262 A | 1/2014 |
| JP | 2015-142117 A | 8/2015 |
| JP | 2015-149339 A | 8/2015 |
| WO | WO 2014-064944 A1 | 10/2013 |

OTHER PUBLICATIONS

Written Opinion of The International Searching Authority dated Jun. 28, 2016 by the International Searching Authority in corresponding International Application No. PCT/JP2016/059992, and English translation thereof.

Office Action issued in counterpart Japanese Patent Application No. 2018-507856, dated May 15, 2019, and English translation thereof.

400
SUBSTRATE BONDING APPARATUS AND SUBSTRATE BONDING METHOD

BACKGROUND

1. Technical Field

The contents of the following International patent application are incorporated herein by reference:
PCT/JP2016/059992 filed on Mar. 28, 2016.

The present invention relates to a substrate bonding apparatus and a substrate bonding method.

2. Related Art

There are apparatuses that bond pairs of substrates by activating surfaces of the substrates and bringing the activated surfaces into contact with each other (please see Japanese Patent Application Publication No. 2013-258377, for example).

If positional misalignment between two substrates caused by a difference in distortion amounts between the substrates is corrected by generating a temperature difference therebetween, the temperature difference becomes small due to thermal transfer that occurs when the substrates are brought into contact with each other. Because of this, the two substrates are bonded with appropriate correction being not performed by a temperature difference.

A first aspect of the present invention provides a substrate bonding apparatus that brings a part of a surface of a first substrate and a part of a surface of a second substrate into contact to form contact regions at the parts, and then enlarges the contact regions to bond the first substrate and the second substrate, the substrate bonding apparatus including: a temperature adjusting unit that adjusts a temperature of at least one of the first substrate and the second substrate such that positional misalignment between the first substrate and the second substrate does not exceed a threshold at least in a course of enlargement of the contact regions.

A second aspect of the present invention provides a substrate bonding method of bringing a part of a surface of a first substrate and a part of a surface of a second substrate into contact to form contact regions at the parts, and then enlarging the contact regions to bond the first substrate and the second substrate, the substrate bonding method including: adjusting a temperature of at least One of the first substrate and the second substrate such that positional misalignment between the first substrate and the second substrate does not exceed a threshold at least in a course of enlargement of the contact regions.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
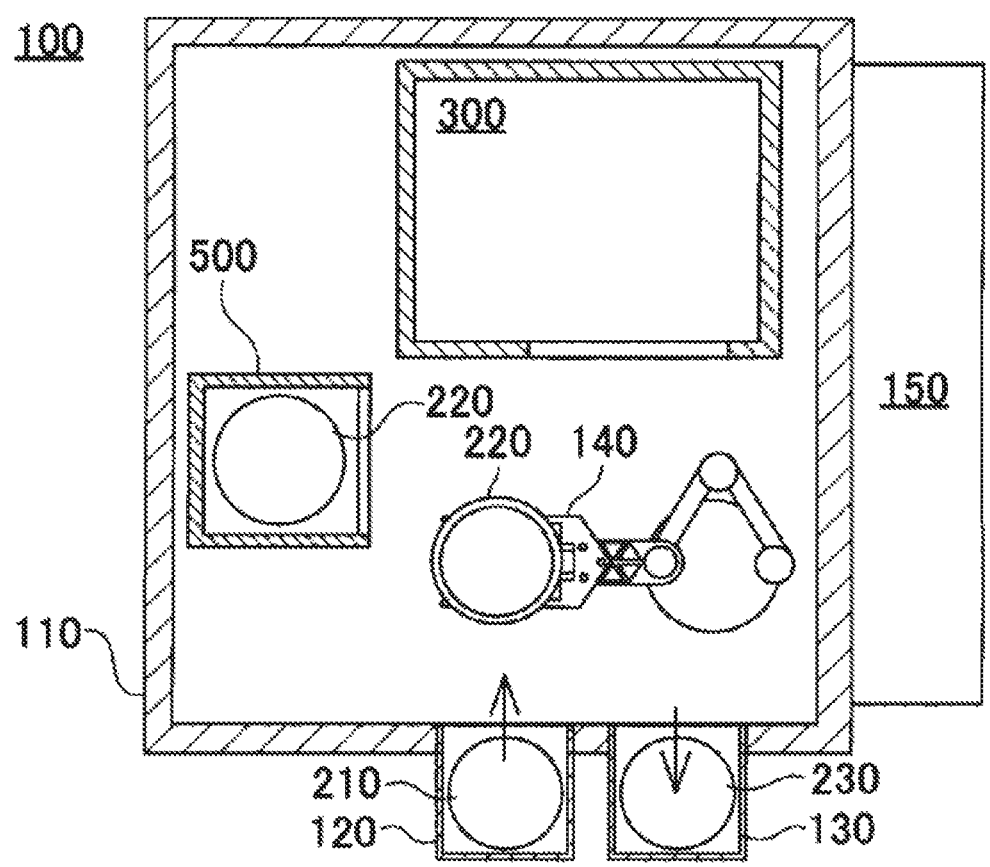
FIG. 1 is a schematic view of a substrate bonding apparatus 100.

FIG. 1 is a schematic plan view of a substrate bonding apparatus 100. The substrate bonding apparatus 100 includes: a housing 110; substrate cassettes 120, 130 and a control unit 150 that are disposed on the outside of the housing 110; and a carrying unit 140, a bonding unit 300 and a pre-aligner 500 that are disposed inside the housing 110. The internal temperature of the housing 110 is managed, and is for example kept at room temperature.

One of the substrate cassettes, the substrate cassette 120, houses a plurality of substrates 210 that are about to be placed one upon another, and the other one of the substrate cassettes, the substrate cassette 130, houses a plurality of bonded substrates 230 fabricated by placing the substrates 210 one upon another.

The carrying unit 140 serves the carriage function inside the housing 110. The carrying unit 140 carries a single substrate 210, a substrate holder 220, a substrate holder 220 holding a substrate 210, a bonded substrate 230 formed by stacking substrates 210 and the like.

The control unit 150 performs overall control of the respective units of the substrate bonding apparatus 100 such that they cooperate with each other. In addition, upon receiving a user instruction from the outside, the control unit 150 sets manufacturing conditions to be applied in manufacturing bonded substrates 230.

The bonding unit 300: has a pair of stages each of which holds a substrate 210 and faces the other; under the control of the control unit 150, positions the substrates 210 held on the stages relative to each other; and thereafter brings them into contact with each other and bonds them together. Thereby, a bonded substrate 230 is formed.

A substrate holder 220 is formed of a hard material such as alumina ceramics, and sectionally attracts and holds a substrate 210. Inside the substrate bonding apparatus 100, each of substrate holders 220 holds a substrate 210 and is handled integrally with the substrate 210.

If a bonded substrate 230 is to be carried out of the substrate bonding apparatus 100, the bonded substrate 230 is separated from the substrate holder 220, and the substrate holder 220 is carried to the pre-aligner 500 so as to hold a substrate 210 to be bonded next.

The pre-aligner 500 cooperates with the carrying unit 140 to cause a substrate holder 220 to hold a substrate 210 carried into the substrate bonding apparatus 100.

Besides substrates on which elements, circuits, terminals and the like are formed, the substrate bonding apparatus 100 can also bond, as substrates 210, unprocessed silicon wafers, SiGe substrates doped with Ge, Ge single-crystal substrates, compound semiconductor wafers such as III-V group compound substrates or II-VI group compound substrates, glass substrates or the like. In addition, bonding of a circuit substrate on which a circuit is formed with an unprocessed substrate, and bonding of substrates of the same type, such as bonding of circuit substrates or bonding of unprocessed substrates, are also possible. Furthermore, substrates 210 to be bonded may themselves be bonded substrates 230 already formed by stacking a plurality of substrates.

Figure 2:
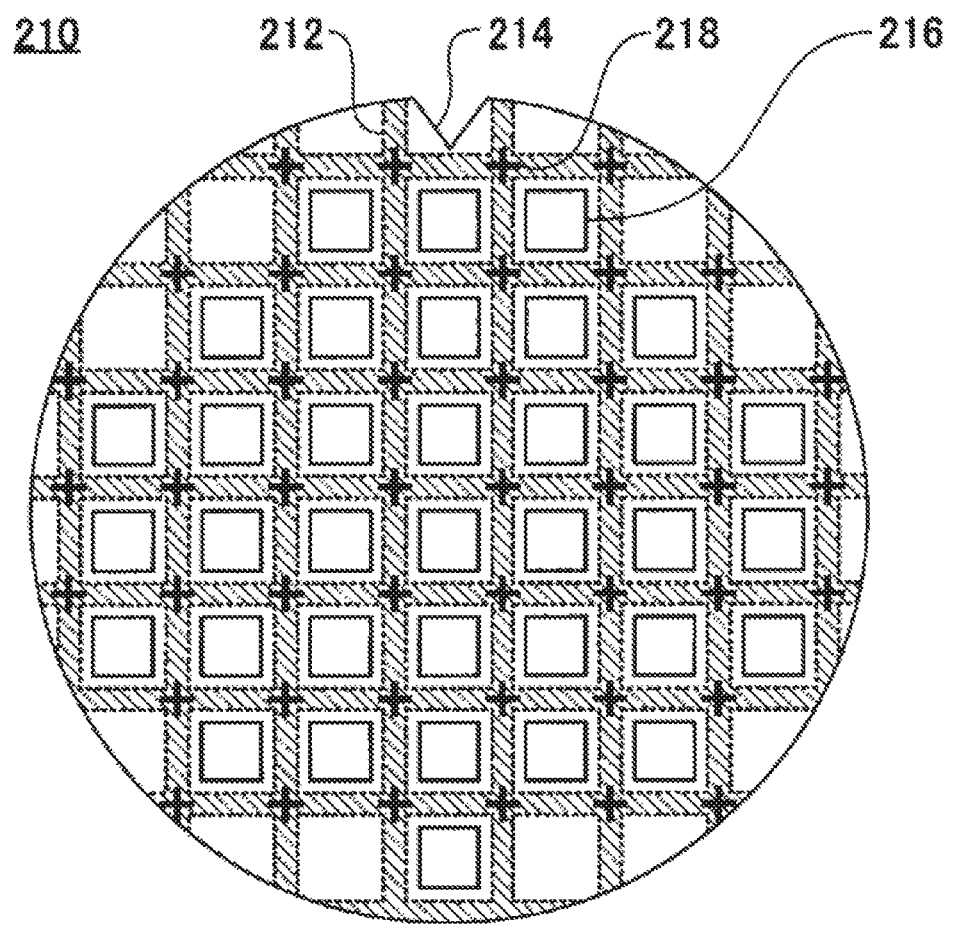
FIG. 2 is a schematic plan view of a substrate 210.

FIG. 2 is a schematic plan view of a substrate 210 to be bonded in the substrate bonding apparatus 100. The substrate 210 has: a notch 214; and a plurality of circuit regions 216 and a plurality of alignment marks 218.

The notch 214 is formed in the circumference of the substrate 210 which is approximately circular entirely, and is used as an index mark for positioning used when the substrate 210 is held by a substrate holder 220, an index mark for knowing an array direction of circuit regions 216 or the like, or an index mark for distinguishing circuit regions 216 if mutually different circuit regions 216 are formed in one substrate 210.

The circuit regions 216 are disposed on a surface of the substrate 210 repeatedly in the plane directions of the substrate 210. Each of the circuit regions 216 is provided with a semiconductor apparatus, wire, protection film or the like formed by a photolithography technique or the like. Also in the circuit regions 216 are disposed a structure including connection portions such as pads, bumps or the like to serve as connection terminals if the substrate 210 is to be electrically connected to another substrate 210, a lead frame or the like.

The alignment marks 218 are disposed for example overlapping scribe lines 212 disposed between the circuit regions 216, and are utilized as index marks if the substrate 210 is to be positioned relative to another substrate 210 which is a stacking target. The alignment marks 218 may be disposed inside the circuit regions 216 or parts of structures formed in the circuit regions 216 may be utilized as the alignment marks 218.

Figure 3:
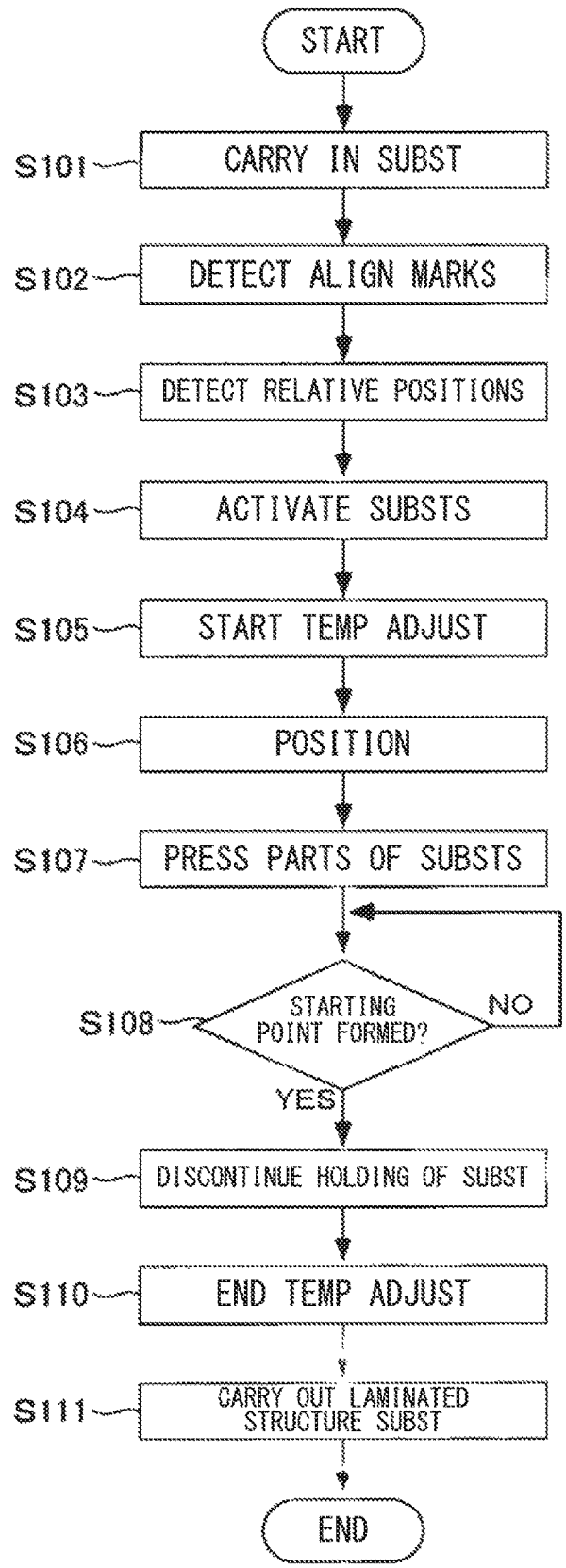
FIG. 3 is a flowchart showing a procedure of placing the substrates 210 one upon another.

FIG. 3 is a flowchart showing a procedure of fabricating a bonded substrate 230 by bonding substrates 210 in the substrate bonding apparatus 100. Inside the substrate bonding apparatus 100, substrates 210 are manipulated one by one while being held by substrate holders 220. Accordingly, the control unit 150 first causes substrate holders 220 to hold substrates 210 taken out of the substrate cassette 120 one by one in the pre-aligner 500. Next, the control unit 150 causes a plurality of substrates 210 which are to be bonded together to be carried into the bonding unit 300 together with the substrate holders 220 (Step S101).

Next, the control unit 150 detects alignment marks 218 provided to a substrate 210 (Step S102). In addition, based on the positions of the detected alignment marks 218, the control unit 150 detects the relative positions of the plurality of substrates 210 to be bonded (Step S103).

Next, the control unit 150 activates surfaces of the substrates 210 (Step S104). The surfaces of the substrates 210 can be activated for example by making them exposed to plasma and purifying them. Thereby, if a substrate 210 is brought into contact with another substrate 210, the substrates 210 adhere to each other and become integrated. Substrates 210 can be activated also by a mechanical process such as polishing.

In addition, surfaces of substrates 210 can be activated by chemically purifying them using a liquid or gas etchant, for example. In addition, besides a method of exposing substrates 210 to plasma, substrates 210 can be activated by sputter-etching using an inert gas, an ion beam, a fast atomic beam or the like. If an ion beam or fast atomic beam is used, the bonding unit 300 can be generated in a reduced pressure.

Furthermore, substrates 210 can also be activated by ultraviolet light irradiation, an ozone asher or the like. Multiple types of activation methods may also be used in combination. After activation of surfaces of substrates 210, the surfaces of the substrates 210 may be hydrophilized using a hydrophilizing apparatus.

Next, the control unit 150 starts adjusting the temperatures of the substrates 210 to be bonded (Step S105). The temperature adjustment executed here is, for example, temperature adjustment for correcting positional misalignment between two substrates 210 in the plane directions along surfaces caused by a difference in distortion amounts between them, and generates a temperature difference between the two substrates 210. In addition, deformation of substrates 210 such as warping may be corrected using a method other than temperature adjustment in combination. Thereby, even if each of substrates 210 is distorted uniquely, the plurality of substrates 210 can be positioned accurately.

Positional misalignment is misalignment in relative positions between two substrates 210, and is misalignment relative to positions of two substrates at which they are located after the two substrates 210 are positioned relative to each other as mentioned below or misalignment of one substrate 210 relative to another substrate 210 observed if the position of the other substrate 210 is used as a reference.

Positional misalignment emerges between two substrate 210 as misalignment in relative positions of mutually corresponding structures or alignment marks. Positional misalignment includes misalignment caused by movement or rotation of a substrate 210 itself on a plane of the substrate 210 and misalignment caused by a difference in distortion amounts mentioned below generated to two substrates 210, and includes not only misalignment generated to an entire substrate 210, but also misalignment generated to a substrate 210 partially.

Next, the control unit 150 positions the plurality of substrates 210 to be bonded relative to each other (Step S106). The positioning is executed by relatively moving one substrate 210 relative to another substrate 210 based on the relative positions of the substrates 210 detected at Step S103.

Next, in order to form a bonding starting point between substrates 210, the control unit 150 brings parts of respective surfaces of the positioned substrates 210 into contact with each other (Step S107). The mutually contacting parts are contact regions where the substrates 210 contact each other, and which are formed when bonding starts. The contacting parts are preferably in contact with each other at a point.

When a bonding starting point is formed between a pair of substrates 210 to be bonded, a part of one substrate 210 is pressed toward a part of another substrate 210 so that atmospheric gas or the like sandwiched between the substrates 210 is expelled and surfaces of the substrates 210 are brought into direct contact with each other. Because of this, if the viscosity of the atmospheric gas is high and if the activity of the substrates 210 is low, it takes time in some cases to bring two substrates 210 into contact with each other.

Due to this contact, the contact regions of the two substrates 210 that have been activated are coupled by chemical bonds such as hydrogen bonds. After the parts of the two substrates 210 are brought into contact, the two substrates 210 are kept in contact with each other. At this time, the contact regions may be enlarged by increasing the areas of the contacting parts by pressing the substrates 210 against each other. After the passage of a predetermined length of time while the contacting state is being maintained, coupling force which is strong enough to keep positional misalignment from occurring between the two substrates 210 in the course of bonding of the substrates 210 is surely produced between the two substrates 210. Thereby, a bonding starting point is formed between the mutually contacting parts of the substrates 210.

If bonding starting points are formed at a plurality of locations in the plane directions of the substrates 210, bubbles left in regions sandwiched by the plurality of starting points cannot be discharged in the course of bonding; as a result, voids are generated in a finally completed bonded substrate 230, in some cases. In view of this, when substrates 210 are bonded, preferably, a bonding starting point is formed at one location of the substrates 210, and the contact regions are enlarged from the bonding starting point to bond the entire substrates 210.

In view of this, if substrates 210 are bonded in the bonding unit 300, for example, a raised portion is formed in one of the substrates 210 to be bonded, and the raised portion is brought into contact with the other substrate 210 so that a bonding starting point is formed at one predetermined position. Accordingly, when the substrates 210 are bonded, for the purpose of preventing starting points from being formed at a plurality of locations simultaneously and bubbles or the like from being confined between the substrates 210, the shape of the raised portion of the substrate is preferably maintained until a starting point is formed.

Next, the control unit 150 checks whether or not a starting point is formed between the substrates 210, parts of which are pressed against each other (Step S108). Thereby, if it is sensed that a bonding starting point is formed between the substrates 210 (Step S108: YES), the control unit 150 discontinues holding east one substrate 210 and releases it (Step S109).

At this time, upon formation of a bonding starting point between parts of the substrates 210, because the two substrates 210 are coupled by the above-mentioned coupling force at the starting point, the relative positions of the plurality of substrates 210 to be bonded are fixed in the plane directions of the substrates 210. Accordingly, occurrence of positional misalignment between two substrates 210 in the course of enlargement of contact regions is suppressed even if the control unit 150 discontinues holding of at least one of substrates 210 to be bonded.

The discontinuation of holding of one substrate 210 allows the substrates 210 to suctionally attract each other and be bonded with each other. At this time, if surfaces of two substrates 210 are respectively hydrophilized after activation, the two substrates 210 suctionally attract each other due to the intermolecular force between hydrogen molecules of hydroxyl groups at the surfaces.

Thereby, the contact regions of the two substrates 210 sequentially expand to adjacent regions from the starting point, and eventually the entire substrates 210 become bonded, thereby forming a bonded substrate 230. Accordingly, the control unit 150 ends control of the temperatures of the substrates 210 (Step S110), causes the carrying unit 140 to carry out the bonded substrate 230 from the bonding unit 300 (Step S111), causes the substrate holder 220 to be separated from the bonded substrate 230 and then causes the bonded substrate 230 to be housed in the substrate cassette 130.

If a starting point is not formed between the substrates 210 at Step S108 (Step S108: NO), the control unit 150 keeps pressing parts of the substrates 210 against each other so as to form a bonding starting point while continuing holding of both the substrates 210.

Figure 4:
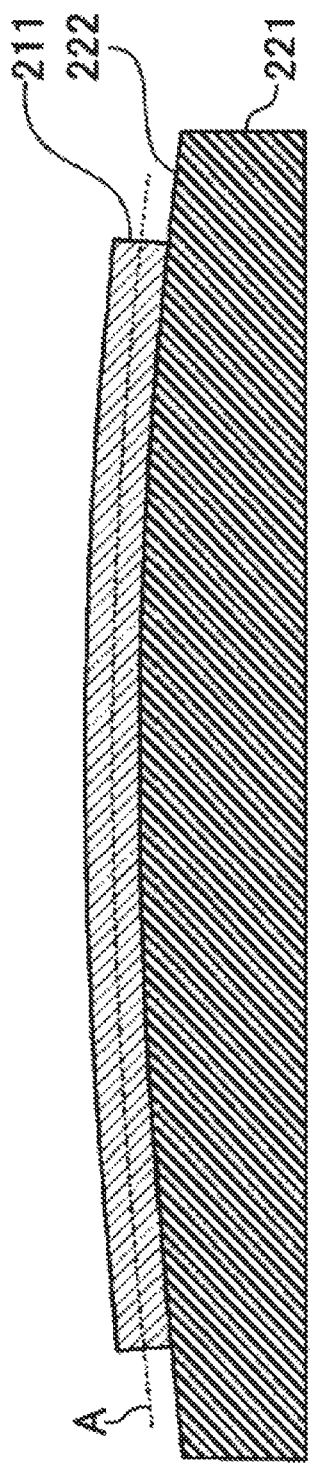
FIG. 4 is a schematic sectional view of a substrate holder 221 holding a substrate 211.

FIG. 4 is a schematic section showing the state where one substrate 211 to be carried into the bonding unit 300 at Step S101 is held by a substrate holder 221. The substrate holder 221 has an electrostatic chuck, vacuum chuck or the like, suctionally attracts the substrate 211 to a holding surface 222 and holds the substrate 211.

The holding surface 222 of the substrate holder 221 has a curved shape with a raised middle side and low circumference. Accordingly, the substrate 211 suctionally attracted to the holding surface 222 also is curved into a shape with a projecting middle side. In addition, while the substrate holder 221 keeps holding the substrate 211, the convex shape of the substrate 210 is maintained. The shape of the holding surface 222 of the substrate holder 221 may be a spherical surface, a paraboloid, a cylindrical surface or the like.

If the substrate 211 is suctionally attracted to the holding surface 222, in the curved substrate 211, at the upper surface of the substrate 211 in the figure, the surface of the substrate 211 deforms to enlarge in the plane direction, as compared to a thickness-wise central portion A of the substrate 211 indicated with an alternate long and short dash line in the figure. In addition, at the lower surface of the substrate 211 in the figure, the surface of the substrate 211 deforms to shrink in the plane direction.

Accordingly, by causing the substrate 211 to be held by the substrate holder 221, the magnification, on the plane, of circuit regions 216 formed on a surface of the substrate 211 relative to design specifications also increases.

Figure 5:
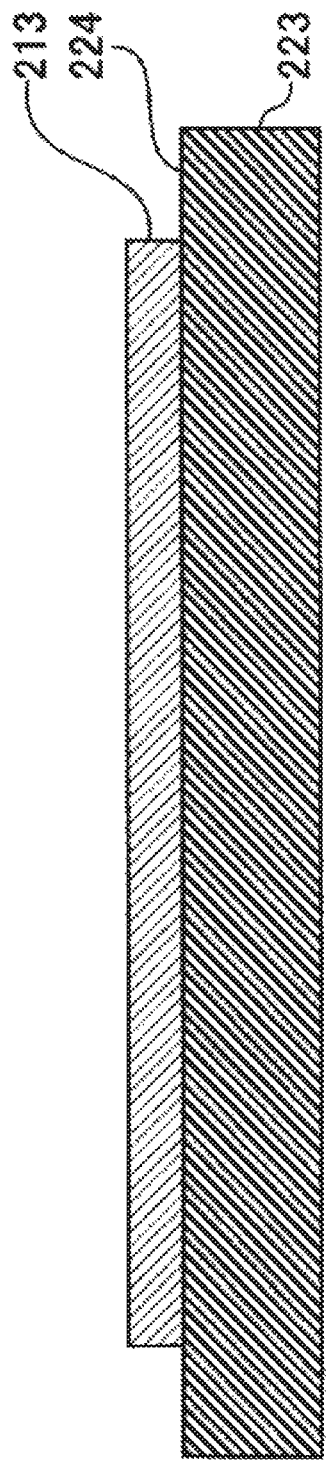
FIG. 5 is a schematic sectional view of a substrate holder 23 holding a substrate 213.

FIG. 5 is a schematic section showing the state where another substrate 213 is held by a substrate holder 223. The substrate holder 223 has a flat holding surface 224 and the function of suctionally attracting the substrate 213 which is achieved by an electrostatic chuck, vacuum chuck or the like. The substrate 213 held by being suctionally attracted to the substrate holder 223 closely contacts the holding surface 224 and becomes flat conforming to the shape of the holding surface 224.

Accordingly, if in the bonding unit 300, the substrate 211 deformed convexly by being held by the substrate holder 221 shown in FIG. 4 is brought into contact with the substrate 213 held by the substrate holder 223 shown in FIG. 5 in the flat state, the substrates 211, 213 contact each other at one middle point. In addition, while each of the substrate holders 221, 223 is holding the corresponding substrate 211 or 213, regions of the substrates 211, 213 on the circumferential side remain separated from each other.

In the above-mentioned example, a combination of the convexly deformed substrate 211 and the flat substrate 213 is mentioned as an example. But for example also in cases that both the substrates 211, 213 are convexly deformed, that the substrates 211, 213 are deformed into a convex shape and a concave shape with mutually different curvatures, and that the substrates 211, 213 are deformed into cylindrical shapes with non-parallel central axes, the substrates 211, 213 can be brought into contact at one point in the bonding unit 300.

Figure 6:
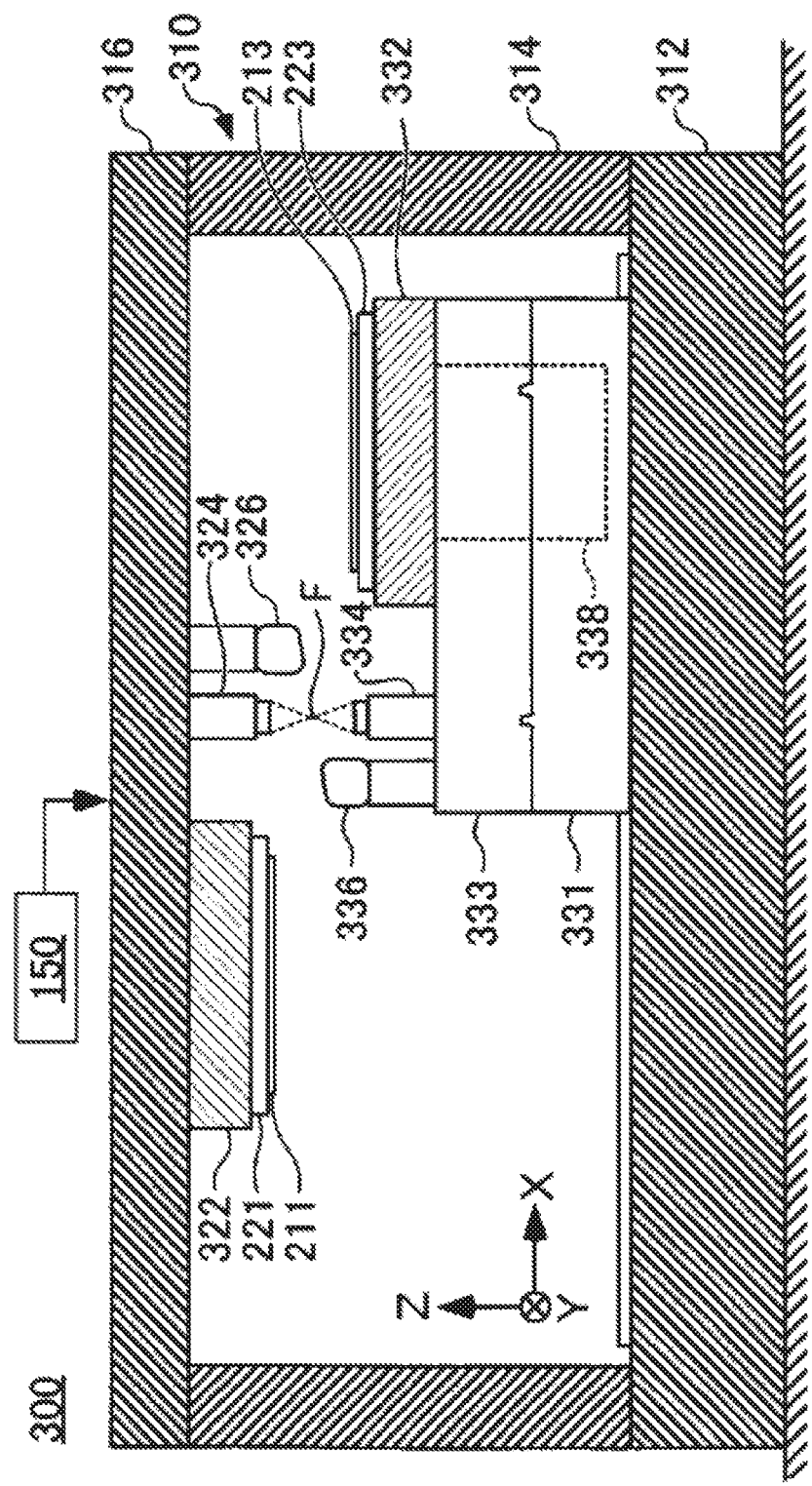
FIG. 6 is a schematic sectional view of a bonding unit 300.

FIG. 6 is a schematic sectional view showing the structure of the bonding unit 300. In addition, FIG. 6 is also a figure showing the state of the bonding unit 300 immediately after the substrates 211, 213 and substrate holders 221, 223 are carried in. The bonding unit 300 includes a frame body 310, an upper stage 322 and a lower stage 332.

The frame body 310 has a base plate 312 and a top plate 316 that are parallel with a horizontal floor surface 301, and a plurality of supports 314 that are vertical to the floor plate. The base plate 312, supports 314 and top plate 316 form the rectangular parallelepiped frame body 310 to house other members of the bonding unit 300.

The upper stage 322 is fixed to the lower surface of the top plate 316 in the figure and faces downward. The upper stage 322 has the holding function that is realized by a vacuum chuck, electrostatic chuck or the like, and forms a holding unit to hold the substrate holder 221. In the illustrated state, the substrate holder 221 holding the substrate 211 already is held by the upper stage 322.

The lower stage 332 is arranged oppositely to the upper stage 322, and is mounted on the upper surface, in the figure, of a Y-direction drive unit 333 placed on an X-direction drive unit 331 disposed on the upper surface of the base plate 312. The lower stage 332 forms a holding unit to hold the substrate 213 oppositely to the substrate 211 held by the upper stage 322. In the illustrated state, the substrate holder 223 holding the substrate 213 already is held by the lower stage 332.

In the illustrated state, the substrate holder 221 having the curved holding surface 222 is held by the upper stage 322 positioned on an upper side in the figure, and the substrate 213 held by the substrate holder 223 having the flat holding surface 224 is held by the lower stage 332 positioned on a lower side in the figure. But combinations of the upper stage 322 and lower stage 332, and the substrate holders 221, 223 are not limited to them. In addition, the flat substrate holder 223 or curved substrate holder 221 may be carried into both the upper stage 322 and the lower stage 332.

In the bonding unit 300, the X-direction drive unit 331 moves in the direction indicated by the arrow X in the figure, in parallel with the base plate 312. On the X-direction drive unit 331, the Y-direction drive unit 333 moves in the direction indicated by the arrow Y in the figure, in parallel with the base plate 312. Operation of these X-direction drive unit 331 and Y-direction drive unit 333 is combined to two-dimensionally move the lower stage 332 in parallel with the base plate 312. Thereby, the substrate 213 mounted on the lower stage 332 can be positioned relative to the substrate 211 held by the upper stage 322.

In addition, the lower stage 332 is supported by a raising/lowering drive unit 338 that rises and lowers vertically to the base plate 312 in the direction indicated by the arrow Z. The lower stage 332 can rise and lower relative to the Y-direction drive unit 333. Thereby, the bonding unit 300 is one example of a pressing unit that presses the substrate 213 mounted on the lower stave 332 against the substrate 213 held by the upper stage 322.

The amount of movement of the lower stage 332 realized by the X-direction drive unit 331, Y-direction drive unit 333 and raising/lowering drive unit 338 is minutely measured using an interferometer or the like. In addition, the X-direction drive unit 331 and Y-direction drive unit 333 may be configured as two stages consisting of a coarse movement unit and a fine movement unit. Thereby, both highly accurate positioning and high throughput can be achieved to make it possible to bond the substrate 211 mounted on the lower stage 332, moving the substrate 211 fast without lowering control accuracy.

On the Y-direction drive unit 333, a microscope 334 and an activating apparatus 326 respectively are further mounted laterally next to the lower stage 332. The microscope 334 enables observation of the downward-facing lower surface of the substrate 213 held by the upper stage 322. The activating apparatus 336 generates plasma to purify the lower surface of the substrate 213 held by the upper stage 322.

The bonding unit 300 may further include a rotation drive unit that rotates the lower stage 332 about a rotation axis vertical to the base plate 312 and an oscillation drive unit that oscillates the lower stage 332. Thereby, the positioning accuracy of the substrates 211, 213 can be improved by rotating the substrate 211 held by the lower stage 332, as well as by making the lower stage 332 parallel with the upper stage 322.

Furthermore, the bonding unit 300 has a pair of a microscope 324 and the microscope 334 and a pair of an activating apparatus 326 and the activating apparatus 336. One of the microscopes, the microscope 324, and one of the activating apparatuses, the activating apparatus 326, are fixed to the lower surface of the top plate 316 and laterally next to the upper stage 322. The microscope 324 enables observation of the upper surface of the substrate 213 held by the lower stage 332. The activating apparatus 326 generates plasma to purify the upper surface of the substrate 213 held by the lower stage 332.

In addition, the other one of the microscopes, the microscope 334, and the other one of the activating apparatuses, the activating apparatus 336, are mounted on the Y-direction drive unit 333 and laterally next to the lower stage 332. The microscope 334 enables observation of the lower surface of the substrate 211 held by the upper stage 322. The activating apparatus 336 generates plasma to purify the lower surface of the substrate 211 held by the upper stage 322.

The microscopes 324, 334 can be used at Step S102 in a procedure like the one explained next. The control unit 150 calibrates the relative positions of the microscopes 324, 334 by making the foci of the microscopes 324, 334 coincide with each other, as shown in FIG. 6.

Figure 7:
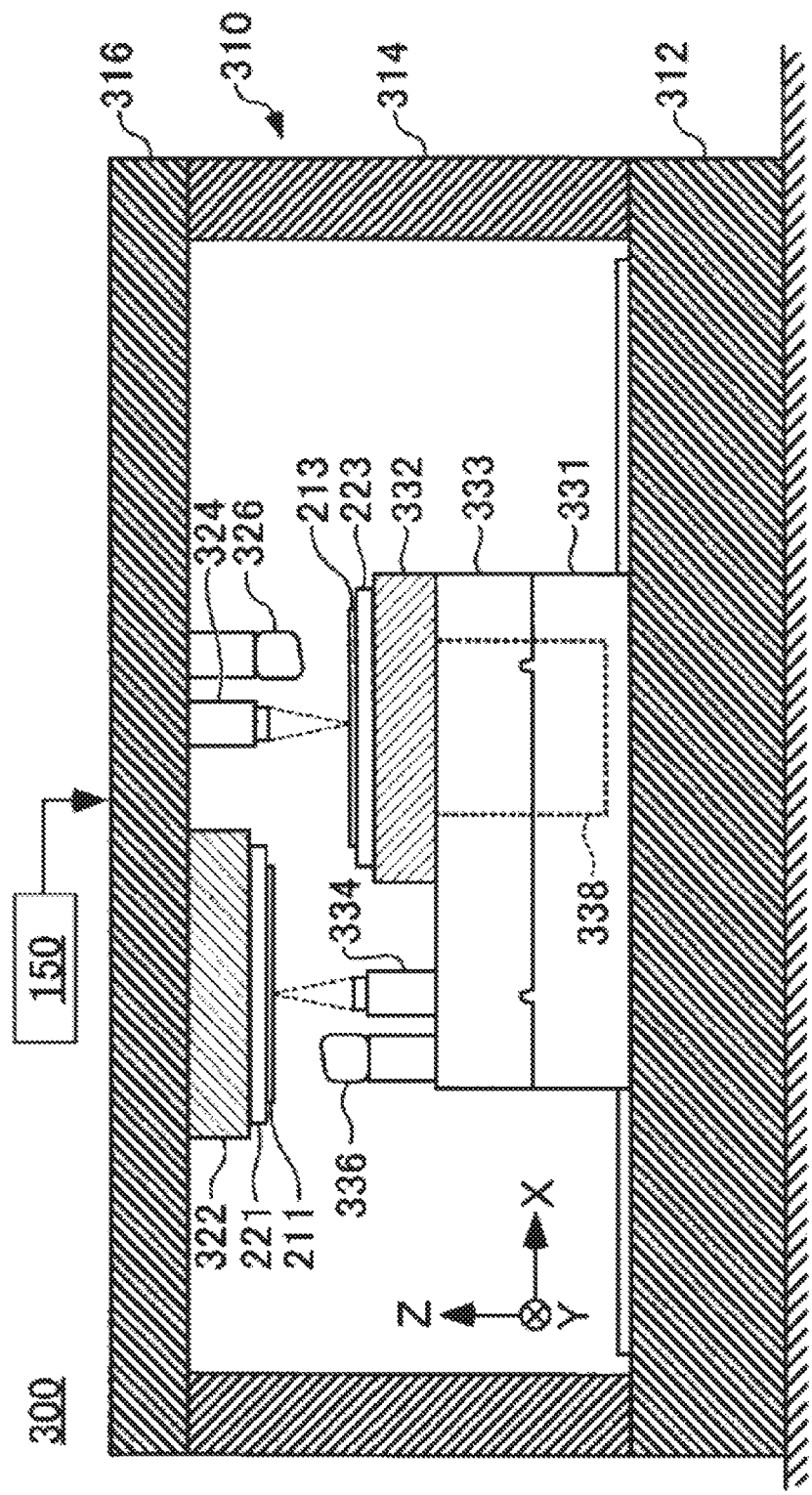
FIG. 7 is a schematic sectional view of the bonding unit 300.

As shown in FIG. 7, the control unit 150 operates the X-direction drive unit 331 and Y-direction drive unit 333 to detect, using the microscopes 324, 334, alignment marks 218 provided to the respective substrates 211, 213 (Step S102 in FIG. 3). The control unit 150 knows the amount of movement of the lower stage 332 realized by the X-direction drive unit 331 and Y-direction drive unit 333 that was made until the alignment marks 218 are detected.

In this manner, by detecting the positions of the alignment marks 218 of the substrates 211, 213 using the microscopes 324, 334 whose relative positions are known, the relative positions of the substrates 211, 213 can be known (Step S103 in FIG. 3). Thereby, when the substrates 211, 213 to be placed one upon another are positioned, relative movement amounts including amounts of relative movement and amounts of rotation of the substrates 211, 213 may be calculated such that an amount of positional misalignment in the plane direction along surfaces between the substrates 211, 213 becomes smaller than a predetermined value. The predetermined value is a misalignment amount that establishes electrical conduction between the substrates 211, 213 when mutual bonding of the substrates 211, 213 is completed, and is a misalignment amount with which structures such as respective connection portions of the substrates 211, 213 contact at least partially if those structures are provided. The predetermined value is 1.0 µm or smaller, for example, and more preferably is 0.5 µm or smaller. If positional misalignment between the substrates 211, 213 becomes equal to or larger than the threshold, connection portions do not contact each other, appropriate electrical conduction cannot be attained therebetween or a predetermined joining strength cannot be attained between joining portions.

However, each of the substrates 211, 213 to form a bonded substrate 230 is individually distorted in some cases. Because of this, even if the lower stage 332 is moved in parallel and rotated so as to statistically minimize the amounts of relative positional misalignment between the substrates 211, 213, many of the alignment marks 218 of the two substrates 211, 213 do not coincide in some cases due to positional misalignment caused by the difference in distortion amounts between the substrates 211, 213. Because of this, if the substrates 211, 213 are distorted individually differently, the amount of positional misalignment between the substrates 211, 213 does not become smaller than a predetermined value in some cases even if relative movement amounts are calculated at Step S106.

Distortion generated to the substrates 211, 213 include: distortion that has certain tendency over the entire substrates 211, 213 such as warping or bending of the substrates 211, 213, that is, distortion that includes components of shifts in the X-direction and Y-direction, components of rotation about the centers of the substrates, components of magnifications in distortion in the radiation directions from the centers of the substrates; orthogonal components; and non-linear components other than them. Orthogonal component distortion is for example distortion generated in mutually opposite directions: in two regions that are divided by a line segment passing through the center of a substrate; and along a line segment passing through the center. The components of magnifications include those related to isotropic magnifications that generate deformation by the same amount in the X-direction and Y-direction, and those related to anisotropic magnifications that generate deformation by different amounts in the X-direction and Y-direction, and the anisotropic magnification components are included in the non-linear components.

These types of distortion are caused by: stress generated in processes of forming alignment marks 218 or circuit regions 216 in the substrates 211, 213; anisotropy due to crystalline orientation of the substrates 211, 213; repetitive changes in rigidity due to arrangement or the like of scribe lines 212, circuit regions 216 or the like; or the like. In addition, even if distortion is not generated to the substrates 211, 213 before being bonded, in the course of bonding during which the contact regions enlarge, the substrates 211, 213 are deformed and distorted in some cases at the boundary between the contact regions which are regions already contacting and non-contact regions which are regions yet to contact.

Such positional misalignment in the plane directions between the substrates 211, 213 caused by a difference in the distortion amounts of the substrates 211, 213 is corrected by means of adjustment of the temperature of at least one substrate (Step S105). In other words, by adjusting the temperature of at least one of the substrates 211, 213 to generate thermal expansion or thermal contraction, the overall size of the at least one of the substrates 211, 213 is changed to correct positional misalignment relative to the other substrate.

When positional misalignment is corrected by means of temperature adjustment, the control unit 150 causes a calculating unit (not illustrated) to calculate an amount of correction to remove the positional misalignment. The calculating unit calculates the enlargement ratio or shrinkage ratio of one substrate relative to the other substrate based on the relative positions of the two substrates 211, 213 detected at Step S103, that is, the positional misalignment amount. At this time, an amount of positional misalignment caused by distortion generated to at least one of the substrates 211, 213 in the course of enlargement of contact regions may be predicted or measured, and the enlargement ratio or shrinkage ratio may be calculated based on the misalignment amount and the positional misalignment amount detected at Step S103.

Next, the calculating unit uses the thermal expansion ratio of the substrate 211 or 213 which is a target of correction to calculate a target temperature difference that is required for enlargement or shrinkage of the substrate at such an enlargement ratio or shrinkage ratio. At this time, a table in which the relationship between temperature differences and amounts of correction are associated are preliminarily stored, and this table may be referred to at the time of calculation of target temperature differences.

In addition to correction by means of temperature adjustment, positional misalignment of the substrate 211 can also be corrected by causing a substrate holder 221 having a curved or bent holding surface 222 to hold the substrate 211.

Furthermore, in the bonding unit 300, at least one of the upper stage 322 and the lower stage 332 on which the substrates 211, 213 are mounted can also be provided with an actuator to mechanically deform the substrate(s) 211, 213 to perform correction by deforming the at least one of the substrates 211, 213. Thereby, the bonding unit 300 can correct positional misalignment between the substrates 211, 213 no matter what components of distortion (linear components, non-linear components) which is a cause of the positional misalignment are.

Figure 8:
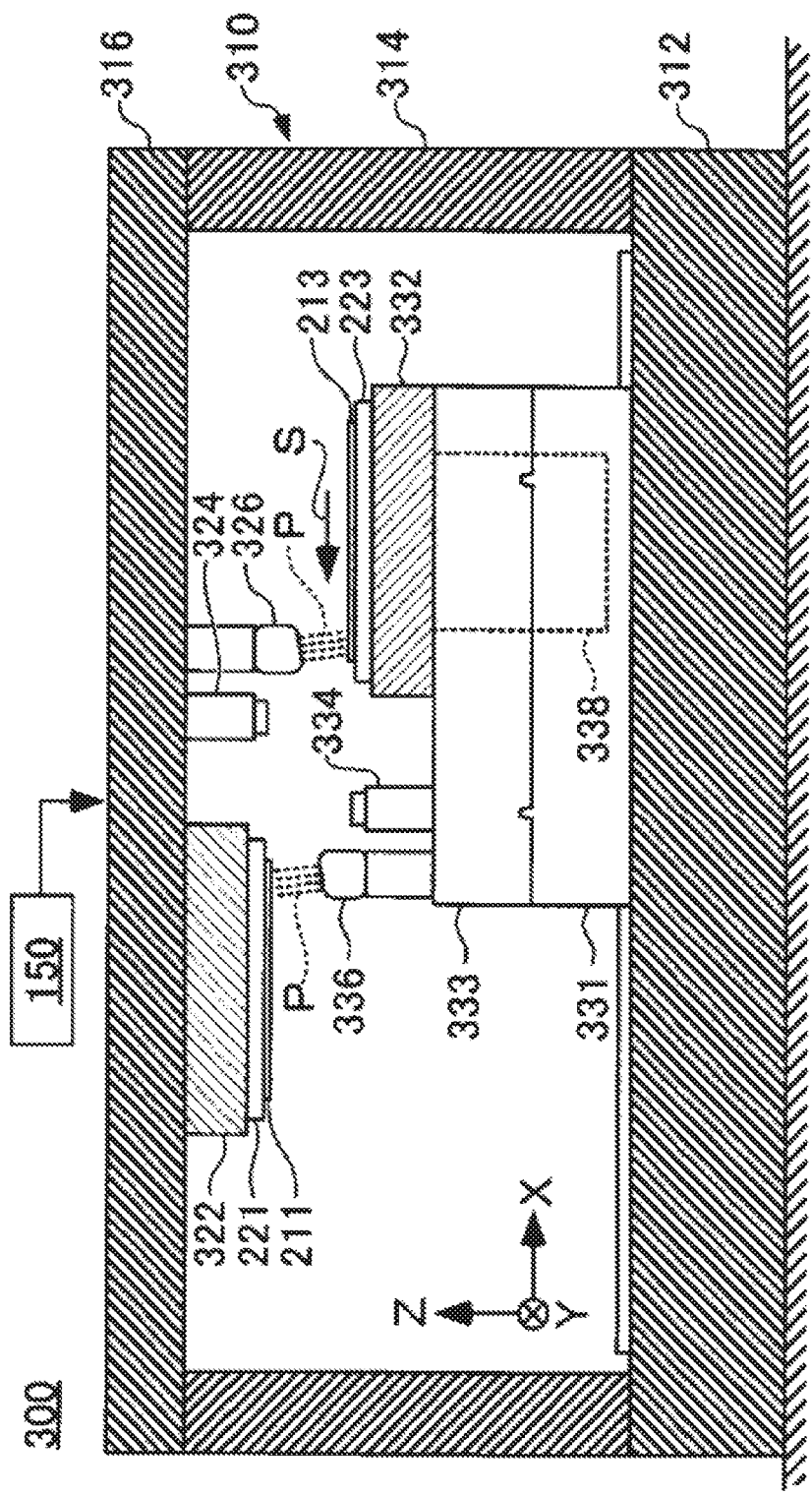
FIG. 8 is a schematic sectional view of the bonding unit 300.

FIG. 8 shows operation performed by the bonding unit 300 to activate the substrates 211, 213 (Step S104 in FIG. 3). The control unit 150 irradiates surfaces of the substrates 211, 213 with plasma, generated by the activating apparatuses 326, 336 sequentially starting at ends thereof, by moving the position of the lower stage 332 horizontally after resetting the position to an initial position. Thereby, the respective surfaces of the substrates 211, 213 are purified and become chemically highly active. Because of this, when having contacted each other, the substrates 211, 213 are suctionally attracted to each other and bonded with each other autonomously.

The activating apparatuses 326, 336 radiate plasma P in directions away from the respective microscopes 324, 334. Thereby, it is possible to prevent the microscopes 324, 334 from being contaminated by fragments generated by the substrates 211, 213 irradiated with plasma.

In the present example, although the bonding unit 300 includes the activating apparatuses 326, 336 to activate the substrates 211, 213, a different structure in which the activating apparatuses 326, 336 of the bonding unit 300 are omitted can also be employed, which structure is made possible by carrying, into the bonding unit 300, the substrates 211, 213 that are activated preliminarily using the activating apparatuses 326, 336 provided separately from the bonding unit 300.

In addition, Step S104 of activating at least one of the substrates 211, 213 and Step S105 of adjusting the temperature of any of the substrates 211, 213 may be replaced with each other in terms of the order. That is, as explained above, the substrates 211, 213 may be activated (Step S104), and thereafter the temperature of at least one of the substrates 211, 213 may be adjusted (Step S105), or the temperature of at least one of the substrates 211, 213 may be adjusted first (Step S105), and thereafter the substrates 211, 213 may be activated (Step S104).

Figure 9:
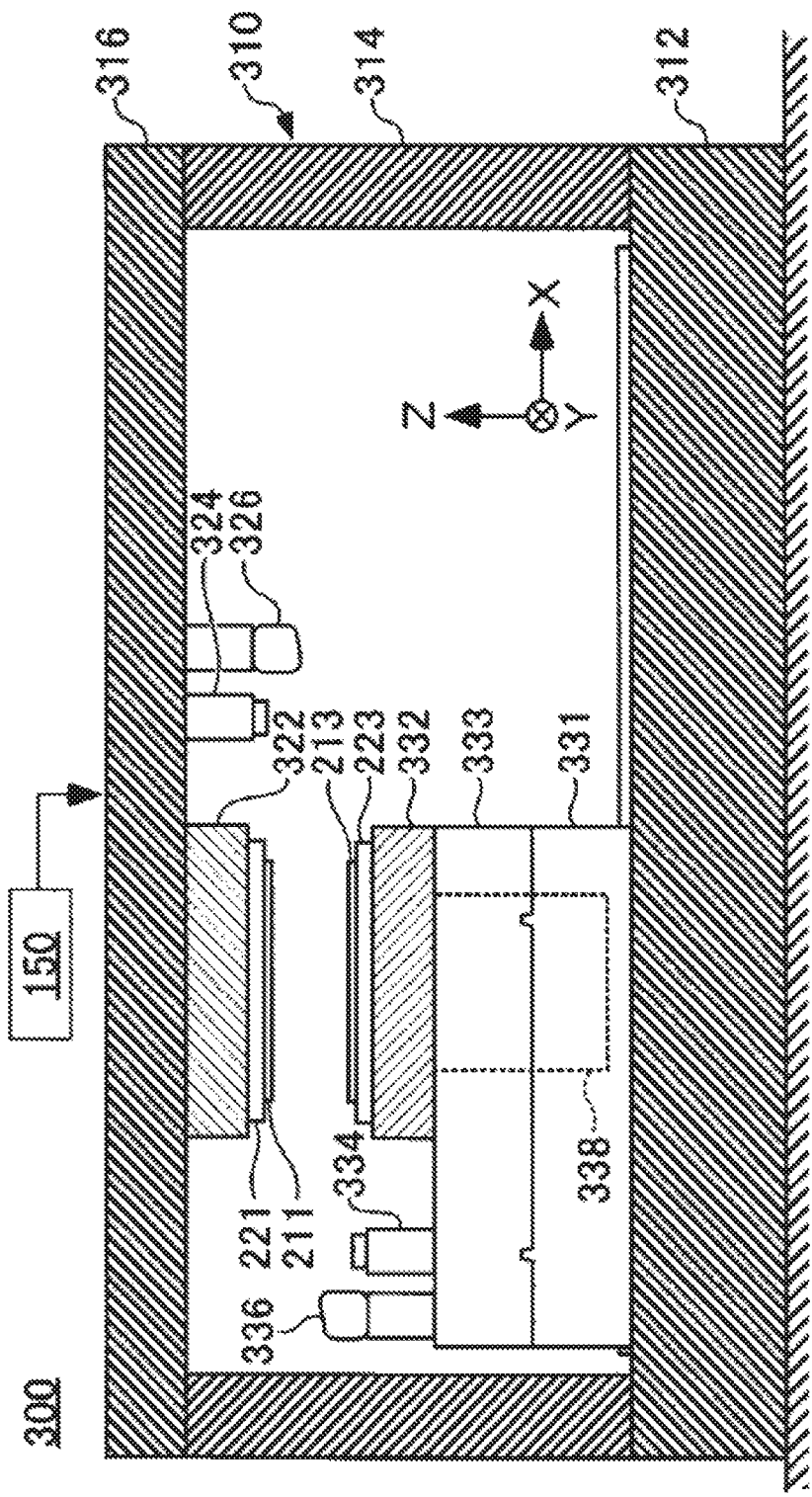
FIG. 9 is a schematic sectional view of the bonding unit 300.

FIG. 9 shows operation performed by the bonding unit 300 to position the substrates 211, 213 (Step S106 in FIG. 3). Based on the relative positions of the microscopes 324, 334 detected first and the positions of the alignment marks 218 of the substrates 211, 213 detected at Step S102, the control unit 150 moves the lower stage 332. At this time, the lower stage 332 may be moved such that the positions of mutually corresponding alignment marks 218 in the plane direction coincide with each other between the two substrates 211, 213 or such that the amounts of relative positional misalignment between the alignment marks 218 relative to each other becomes smaller than the predetermined value mentioned above.

Figure 10:
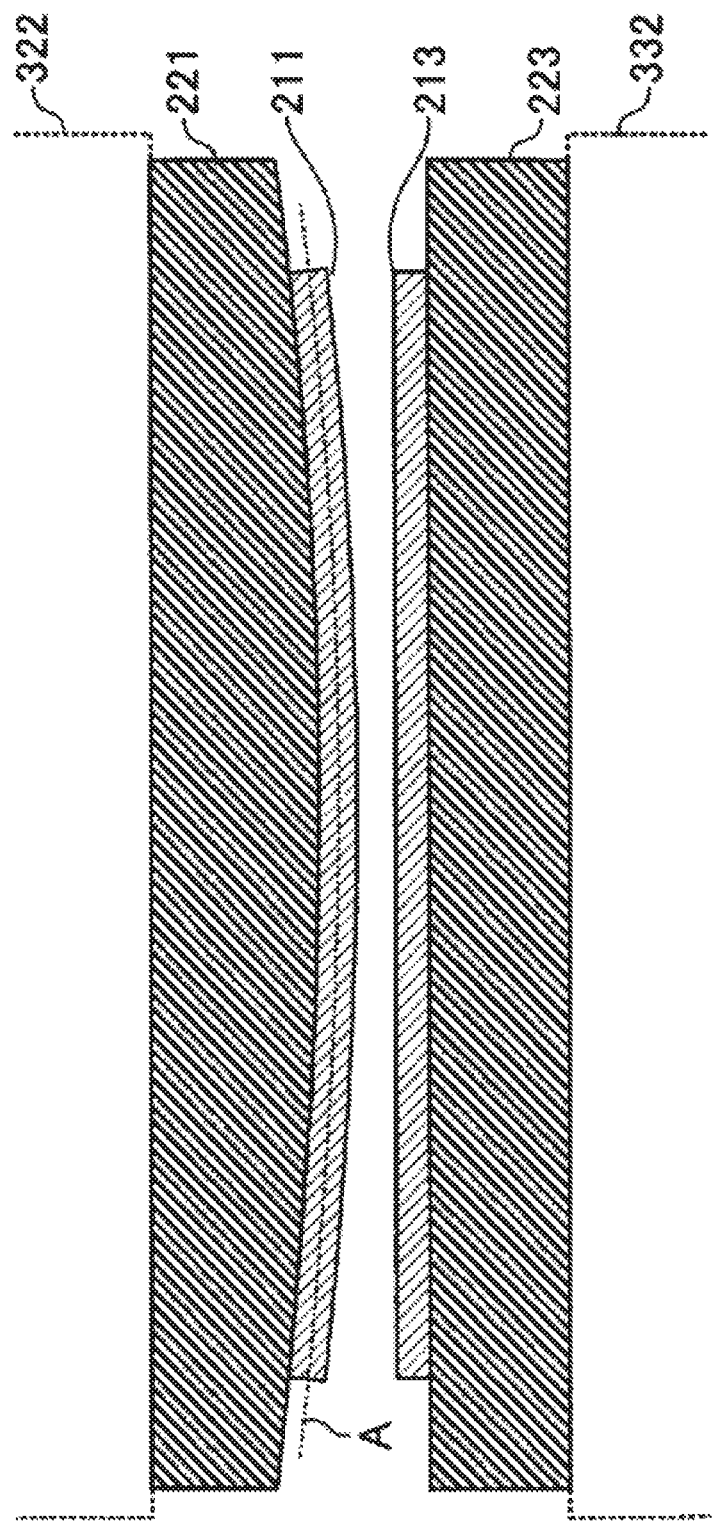
FIG. 10 is a schematic view showing the state of the substrates 211, 213 in the course of bonding.

FIG. 10 is a figure schematically showing how the substrates 211, 213 appear in the state at Step S106 shown in FIG. 9. As illustrated in the figure, the substrates 211, 213 held by the upper stage 322 and lower stage 332 respectively through the substrate holders 221, 223 face each other in a state where they are positioned relative to each other.

Figure 11:
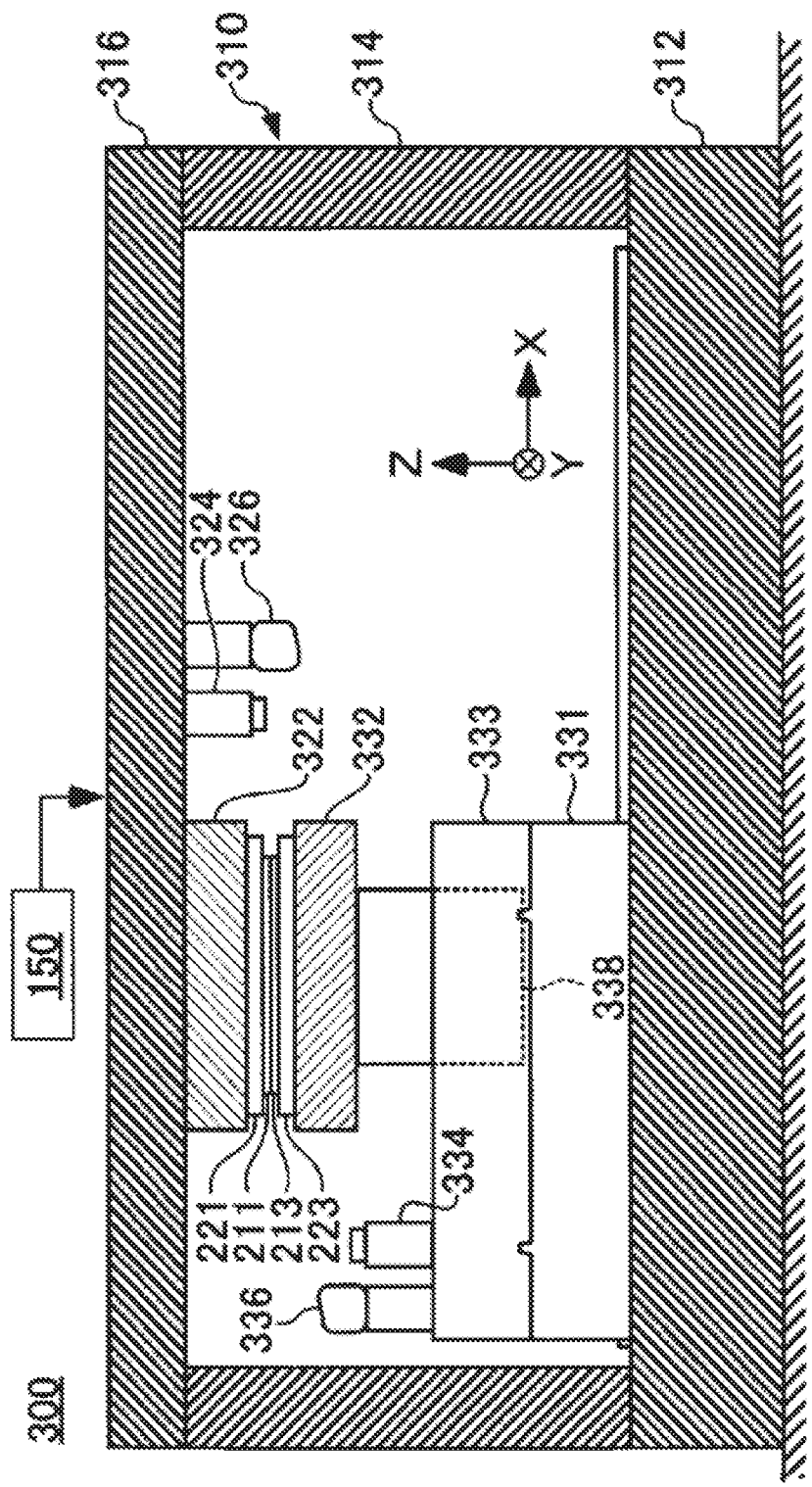
FIG. 11 is a schematic sectional view of the bonding unit 300.

FIG. 11 shows operation performed by the bonding unit 300 to press the substrate 213 held by the lower stage 332 against the substrate 211 held by the upper stage 322 (Step S107 in FIG. 3). The control unit 150 operates the raising/lowering drive unit 338 to raise the lower stage 332 to bring the substrates 211, 213 into contact with each other.

Figure 12:
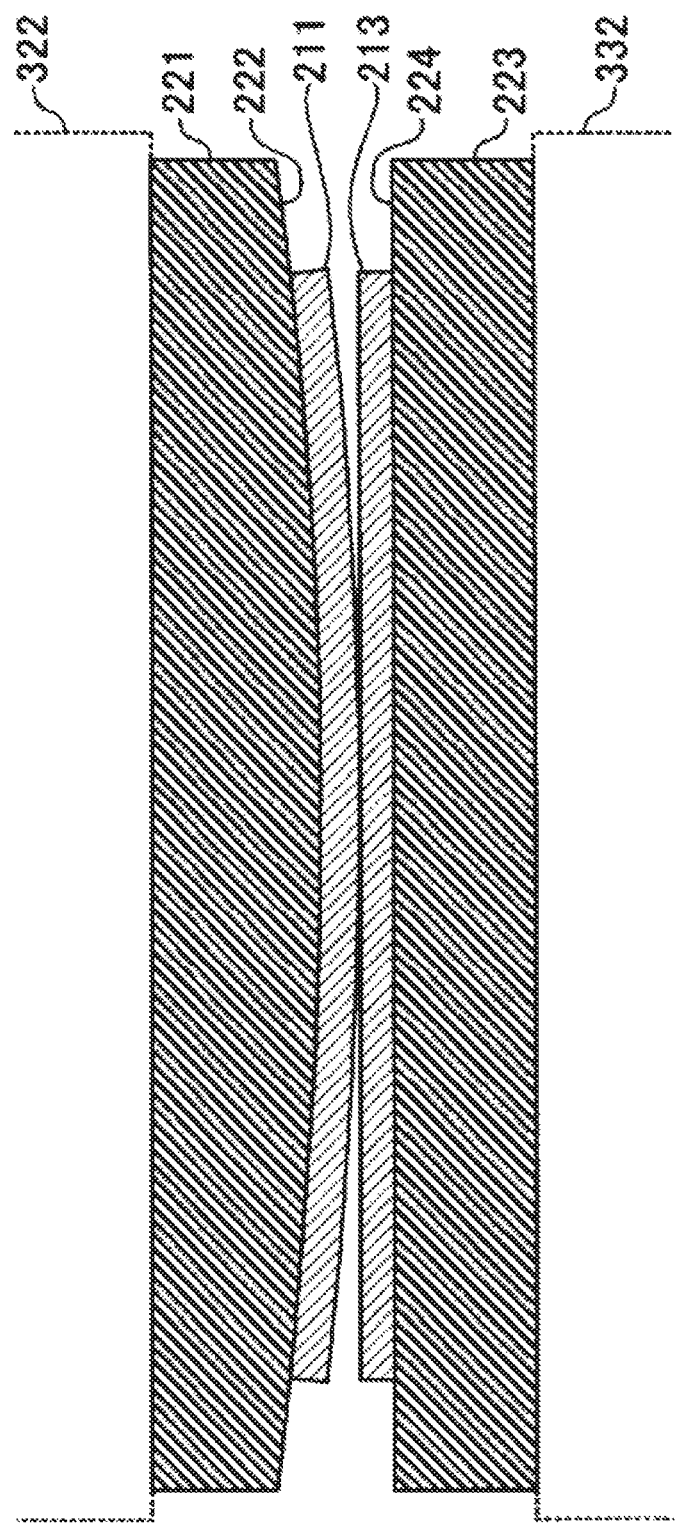
FIG. 12 is a schematic view showing the state of the substrates 211, 213 in the course of bonding.
Figure 22:
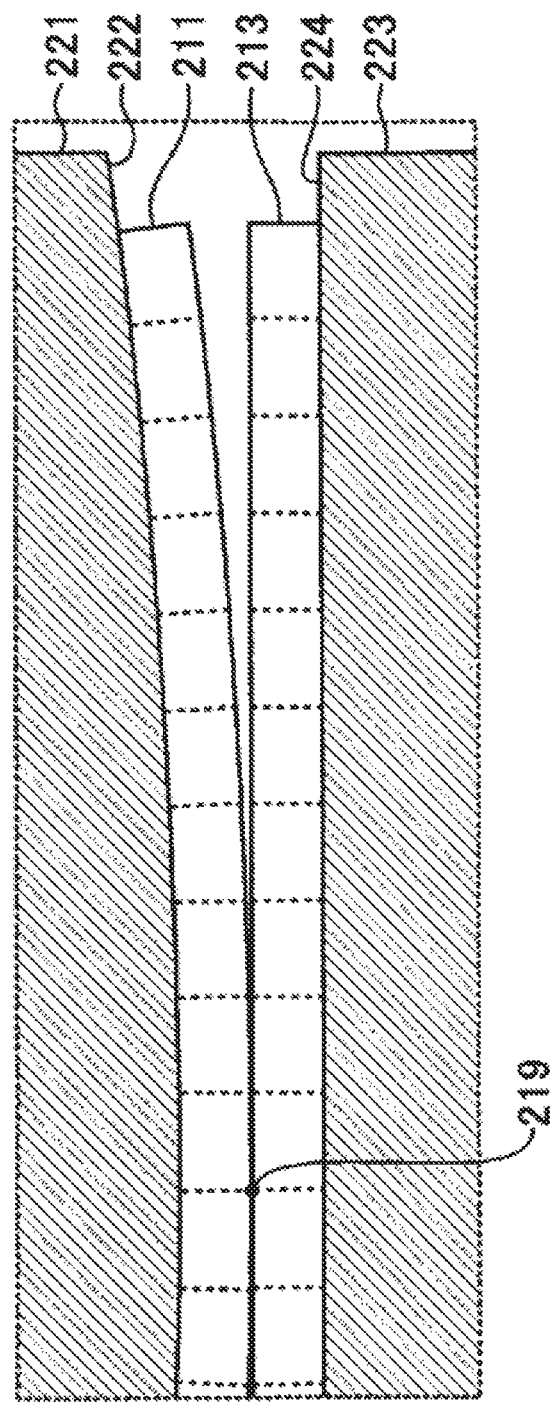
FIG. 22 is a schematic view showing the state of the substrates 211, 213 in the course of bonding.
Figure 23:
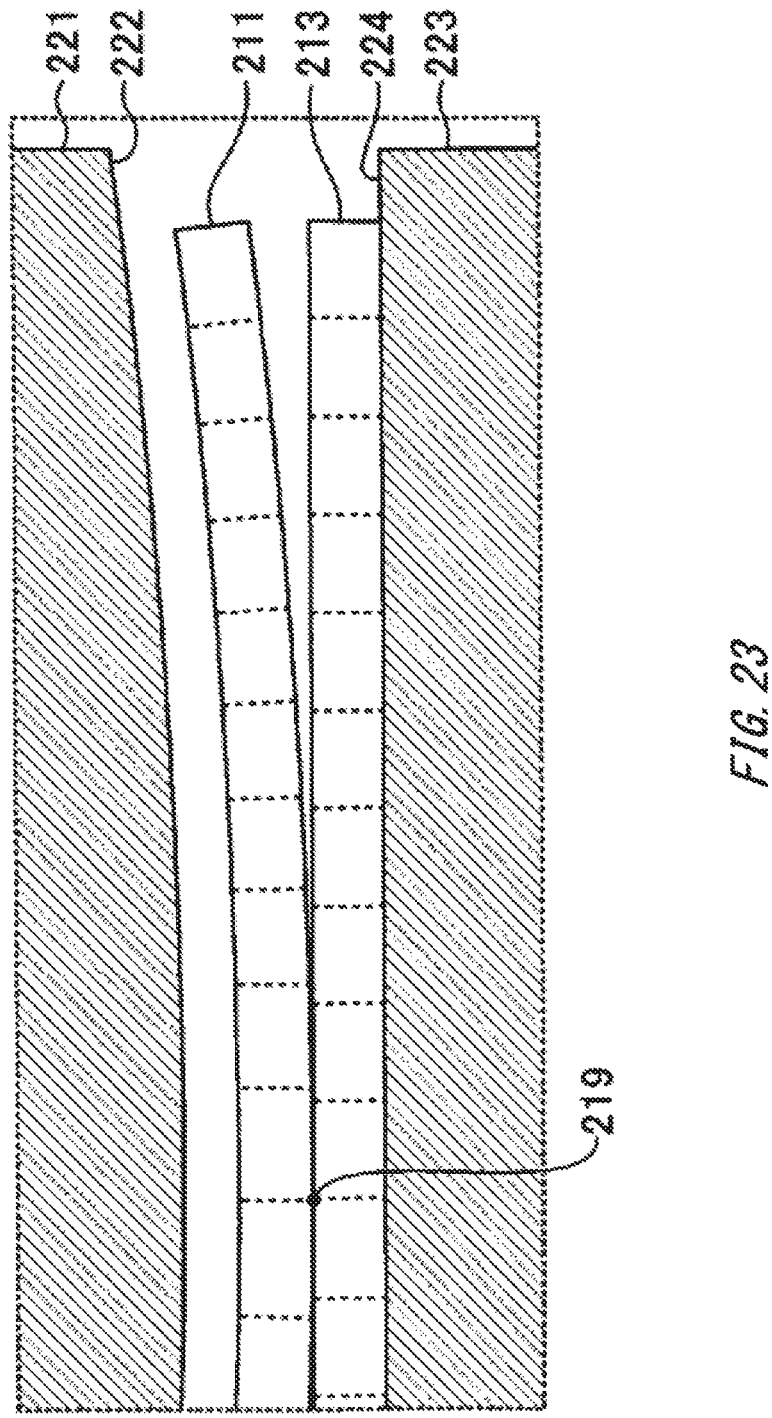
FIG. 23 is a schematic view showing the state of the substrates 211, 213 in the course of bonding.

FIG. 12 is a figure schematically showing how the substrates 211, 213 appear at Step S107 to Step S108 shown in FIG. 10. As illustrated in the figure, because the middle portion of the substrate 211 held by the upper stage 322 is raised, if the lower stage 332 approaches the upper stage 322, first, the middle portions of the substrates 211, 213 contact each other. Furthermore, by the control unit 150 continuing operation of the raising/lowering drive unit 338, the middle portions of the substrates 211, 213 contact each other, and a bonding starting point 219 is formed between the substrates 211, 213 as shown in FIG. 22. FIG. 22 to FIG. 27 are respectively sectional views of the substrates 211, 213. In addition, dotted lines respectively shown in the substrates 211, 213 indicate positions in the radial directions in cross-sections of the substrates 211, 213, and are shown at equal intervals from the centers of the substrates 211, 213 along the radial directions and at mutually corresponding positions between the two substrates 211, 213.

In this state, the substrate holder 221 is holding the substrate 211 such that portions of the substrates 211, 213 other than their middle portions do not contact with each other, and circumferential portions of the substrate 211 are separated from the substrate 213.

Figure 13:
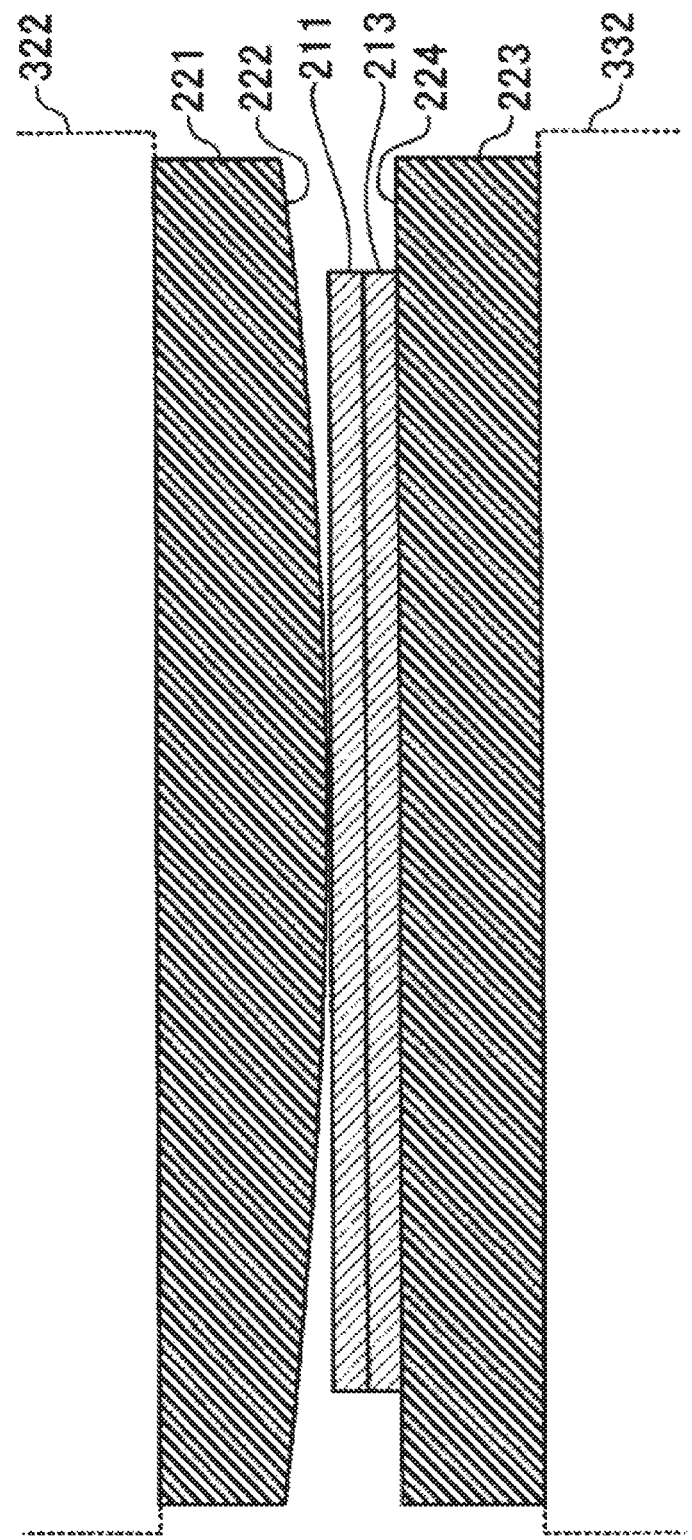
FIG. 13 is a schematic view showing the state of the substrates 211, 213 in the course of bonding.

FIG. 13 is a figure showing the state of substrates 211, 213 at Step S109 shown in FIG. 3. At Step S109, holding of the substrate holder 221 held by the upper stage 322 is discontinued, and the substrate 211 is released.

Because surfaces of the substrates 211, 213 are activated, once parts thereof are brought into close contact with each other to form the bonding starting point 219, adjacent regions are suctionally attracted to each other autonomously due to the intermolecular force that acts between the substrates 211, 213. Accordingly, for example, by releasing holding of the substrate 211 at the upper stage 322, the contact regions of the substrates 211, 213 sequentially expand to adjacent regions.

Stated differently, until holding of the substrate 211 at the upper stage 322 is discontinued, contact at circumferential portions of the substrates 211, 213 is restricted. Because of this, while the substrate 211 is being held by the upper stage 322, enlargement of the contact regions of the substrates 211, 213 is also suppressed.

By discontinuation of the substrate 211 from the substrate holder 221, bonding waves along which the contact regions of the substrates 211, 213 sequentially expand are generated. Eventually, when the bonding waves reach circumferential portions of the substrates 211, 213, the substrates 211, 213 are bonded over the approximately entire surfaces. In the state where the two substrates 211, 213 are bonded, the substrates 211, 213 are coupled by chemical bonds such as hydrogen bonds over their entire surfaces. In this manner, the substrates 211, 213 form a bonded substrate 230.

The substrate 211 being held by the upper stage 322 at the stage of Step S107 is being held with portions thereof near its middle portion projecting more than portions thereof near the circumference. Accordingly, regions at which the substrates 211, 213 are bonded enlarge from the middle of the substrates 211, 213 toward their outer edges. Because of this, an atmospheric gas having been sandwiched between the substrates 211, 213 at the stage prior to bonding of the substrates 211, 213, for example the atmospheric air, is expelled from inner portions of the substrates 211, 213 toward their outer portions in the course of expansion of the areas of the regions at which the substrates 211, 213 are bonded, and it is possible to prevent bubbles from remaining between the bonded substrates 211, 213.

In order to expel bubbles or the like from between the substrates 211, 213 smoothly in the course of placing the substrates 211, 213 one upon another, preferably, at the moment when the substrates 211, 213 start contacting each other, there is a clearance formed between the substrates 211, 213, the clearance being large enough to not inhibit movement of bubbles and continuous at the circumference of the substrates 211, 213. Accordingly, a procedure for deformation of the substrate 211 by causing the substrate 211 to be suctionally attracted to the substrate holder 221 having the curved holding surface 222 is preferably selected such that a certain degree of curvature that makes it possible to expel bubbles remains in the stage of causing the substrate 211 to contact the substrate 213 at Step S107 (FIG. 3). In addition, if it is predicted that the degree of the curvature of the substrate 211 lowers at the stage of placing the substrates 211, 213 one upon another, a substrate holder having a curved holding surface 224 may also be used as the substrate holder 223 to hold the substrate 213 held by the lower stage 332, for the purpose of ensuring that there is a gap for passage of bubbles.

In addition, in the above-mentioned example, holding of the substrate 211 held by the upper stage 322 is discontinued at Step S109. But at the step, holding by the lower stage 332 may be discontinued, or holding of the substrates 211, 213 may be discontinued at both the stages.

However, discontinuation of holding of the substrate 211 results also in discontinuation of correction of distortion by suctional attraction by the substrate holder 221. Accordingly, if holding of a substrate is discontinued at Step S109, preferably, holding of one of the substrates 211, 213 for which the deformation amount of distortion or warping in the plane direction which serves as a cause of positional misalignment between the substrates is relatively small, and the amount of correction is smaller than for the other is discontinued.

In addition, the timing at which holding of the substrate 211 is discontinued at Step S109 depends on whether or not the bonding starting point 219 has been formed which is judged at Step S108. Stated differently, the substrate holder 221 as a holding unit keeps holding the substrates 211, 213 during a period which terminates when bonded regions are formed in parts of the substrates 211, 213. In addition, under the control of the control unit 150, the bonding unit 300 keeps pressing the substrates 211, 213 against each other during a period which terminates when bonded regions are formed in parts of the substrates 211, 213.

The timing at which holding of the substrate 211 is discontinued at Step S109 can be determined based on a result of sensing, by sensing the bonding starting point 219 formed between the substrates 211, 213 after Step S107. The bonding starting point sensing may be performed by optically observing the substrates 211, 213 with light at a wavelength that is transmitted through the substrates 211, 213, using for example partially or entirely transparent stages. In addition, a judging unit that detects variation in mechanical load or electrical load of the raising/lowering drive unit 338 to raise the lower stage 332 and makes a judgement about formation of the starting point 219 may be implemented in the control unit 150, and it may be judged that a starting point 219 is formed, based on a result of the judgment by this judging unit.

In addition, at Step S108, the control unit 150 as a judging unit at the bonding unit 300 may judge that parts of the substrates 211, 213 are bonded and a starting point 219 is formed if a predetermined length of time passed after the parts of the substrates 211, 213 started being pressed against each other. As the length of time to serve as a threshold for judgment, for example, a length of time that is required to bond substrates with the same specifications as the substrates 211, 213 to be bonded and to surely form a starting point 219 may be predetermined.

In addition, the control unit 150 may change the length of time for judging that a bonding starting point 219 is formed, for each lot of the substrates 211, 213 or each type of substrates. The length of time may be changed manually for each target of bonding through the control unit 150, or may be set automatically referring to information stored in association with the types of the substrates 211, 213 to be bonded.

The bonding unit 300 corrects positional misalignment caused by a difference in magnifications of the substrates 211, 213 by adjusting the temperature of at least one of the substrates 211, 213 to be bonded based on a temperature difference calculated in the above-mentioned manner.

Figure 24:
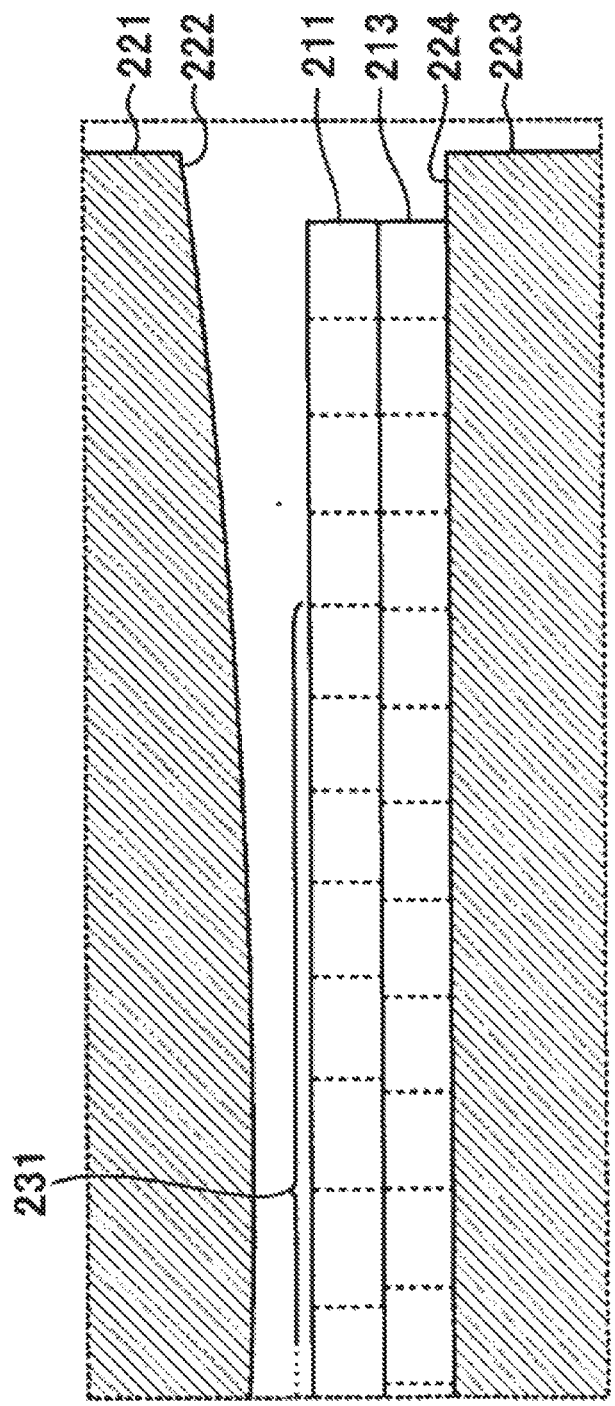
FIG. 24 is a schematic view showing the state of the substrates 211, 213 in the course of bonding.

If a temperature difference is generated between the substrates 211, 213 to be bonded, heat is transferred in the contact regions of the substrates 211, 213 from one of the substrates 211, 213 which is at a higher temperature to the other substrate at a lower temperature, in the course of formation of the starting point 219 between the substrates 211, 213 and the course of enlargement of the contact regions, and the temperature difference between the substrates 211, 213 deviates from the set temperature difference. Because of thermal transfer within the substrate at a lower temperature from the contact region of the substrate to a non-contact region, the temperature of the non-contact region changes, and the non-contact region is deformed as indicated by dotted lines in FIG. 23. If thermal deformation is generated to the non-contact region, positional misalignment is generated between the substrates 211, 213 in a region 231 when the non-contact regions of both the substrates 211, 213 are bonded together as shown in FIG. 24. This positional misalignment is indicated by misalignment in the positions of mutually corresponding dotted lines between the substrates 211, 213 in FIG. 24. This deformation includes stretching/shrinking deformation or warping deformation along the plane directions of the substrates 211, 213.

In view of this, after parts of the substrates 211, 213 contact each other, contact regions are formed, and a temperature difference between the substrates 211, 213 at those parts starts decreasing and before the temperature difference becomes smaller than a value in a predetermined tolerated range, that is, before the temperatures of non-contact regions of the two substrates 211, 213 change due to thermal transfer from the contact regions and the temperature difference between the non-contact regions exceeds a predetermined range, that is, before positional misalignment which is equal to or larger than a threshold is generated between the non-contact regions because of generation of deformation to a non-contact region of at least one of the substrates 211, 213, holding of one of the substrates 211, 213 is discontinued to start enlargement of the contact regions. Bonding waves are generated at the circumference of the enlarging contact regions, and expansion of the contact regions of the substrates 211, 213 proceeds.

Here, due to mechanical coupling between the substrates 211, 213, generation or enlargement of misalignment is suppressed at portions that have become the contact regions in the substrates 211, 213 even if a temperature difference between the substrates 211, 213 decreases. On the other hand, in non-contact regions of the substrates 211, 213 at which the substrates 211, 213 are not in contact with each other yet and which are located outside the bonding waves, a temperature difference between substrates 211, 213 decreases due to thermal conduction between the substrates 211, 213 that are in contact with each other in the contact regions adjacent thereto. Because of this, if reduction of a temperature difference between the substrates 211, 213 is more than a preset tolerated range, misalignment is generated to the substrates 211, 213.

Changes in the temperature difference between the non-contact regions can be predicted based on the states of bonding surfaces of the substrates 211, 213 such as flatness thereof, a length of time in which the contacting state of the substrates 211, 213 continues until enlargement of the contact region starts, and various characteristics such as the thicknesses and thermal conductivity of the substrates 211, 213. Accordingly, the above-mentioned appropriate tolerated range can be preset.

Figure 25:
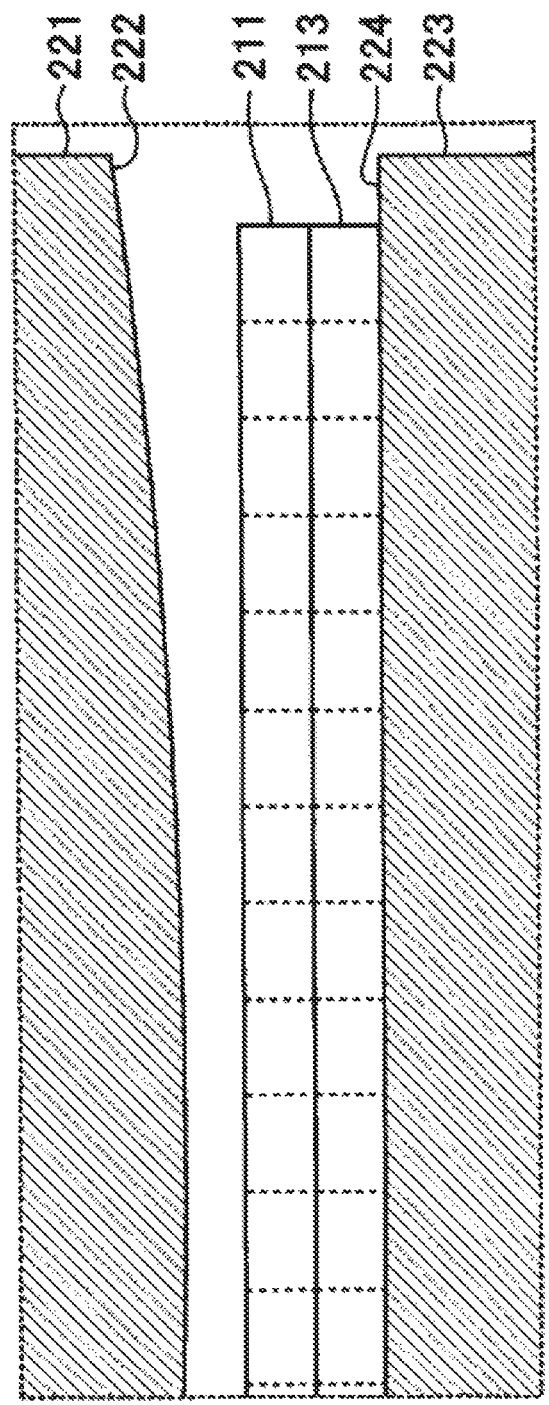
FIG. 25 is a schematic view showing the state of the substrates 211, 213 in the course of bonding.

In addition, the above-mentioned temperature difference between the substrates 211, 213 only has to be generated between mutually contacting surfaces, and the temperature difference may not be generated between the entire substrates 211, 213. Accordingly, by starting enlargement of the contact regions after contact between the substrates 211, 213 is detected and before the temperature difference becomes smaller than values in a predetermined tolerated range, as shown in FIG. 25, the effective temperature difference between the substrates 211, 213 can be maintained and the substrates 211, 213 can be bonded without positional misalignment being generated therebetween.

Figure 14:
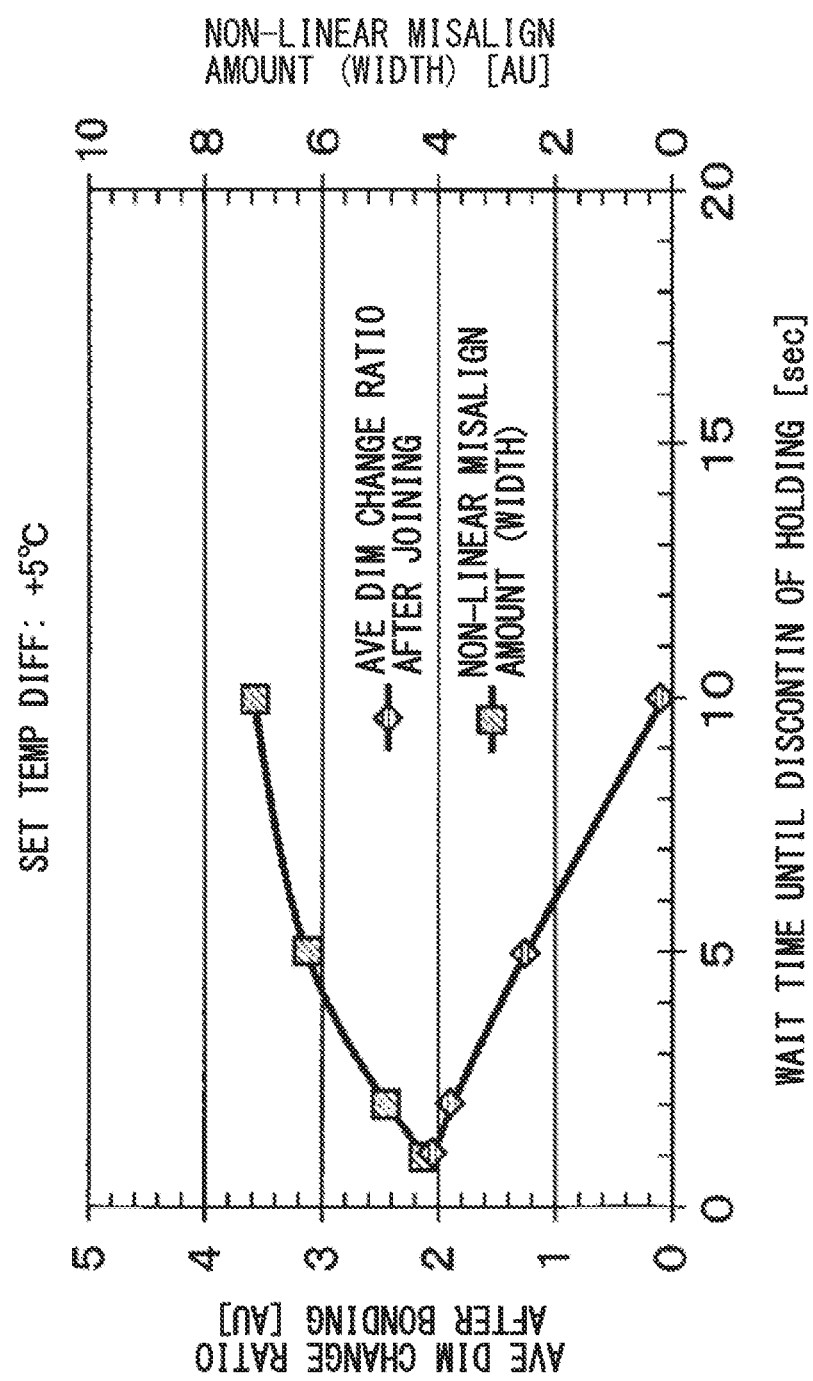
FIG. 14 is a graph showing positional misalignment in a bonded substrate 230.

FIG. 14 is a graph showing one example of average magnifications and non-linear misalignment amounts after joining, generated to the bonded substrate 230 if the substrates 211, 213 having a temperature difference are bonded. The average magnifications are the averages of differences in magnifications between the substrates 211, 213 at a plurality of locations on planes of the bonded substrates 211, 213. The non-linear misalignment amounts are amounts of misalignment between the substrates 211, 213 caused by non-linear component distortion generated in the course of contact between the substrates 211, 213 until completion of bonding.

In the illustrated example, in an initial period of the start of bonding, temperature difference of 5° C. is generated between the substrates 211, 213 that do not have a difference in magnifications and a non-linear misalignment amount generated therebetween, and positive magnification deformation is generated to one substrate of the two substrates 211, 213 relative to the other. The horizontal axis of the graph indicates waiting time starting when parts of the substrates 211, 213 are brought into contact at Step S107 (please see FIG. 3) and terminating when holding of the substrates 211, 213 is discontinued at Step S109 (please see FIG. 3). The rates of change in respective graphs of the average magnifications and non-linear misalignment amounts change corresponding to the thermal transfer coefficients of the two substrates 211, 213 to be bonded.

In the illustrated graph, the average magnifications and non-linear misalignment amounts of the bonded substrate 230 are plotted, which correspond to a case where in bonding the substrates 211, 213 for which a temperature difference of 5° C. is set, holding of one of the substrates, the substrate 211, is discontinued one second after, two seconds after, five seconds after and ten seconds after parts of the substrates 211, 213 are brought into contact with each other, and the entire substrates 211, 213 are bonded.

As illustrated in the figure, the longer the waiting time that lasts until holding of the substrate 211 is discontinued, that is, the length of time in which a part of the substrate 211 is kept in contact with the substrate 213 is, the lower the average magnifications after bonding of the substrates 211, 213 are. A reason for this is presumed to be that as the waiting time in which the substrates 211, 213 are pressed against each other increases, heat is transferred from one of the substrates 211, 213 which is at a higher temperature to the other substrate at a lower temperature, and the temperatures of the two substrates 211, 213 become nearly equal to each other and so the amounts of deformation caused by heat of the two substrates 211, 213 also become nearly equal to each other. Accordingly, when a substrate subjected to magnification correction by means of a temperature difference is bonded to another substrate, that is, two substrates whose difference in magnifications was made smaller than a predetermined value by means of a temperature difference are bonded, as the waiting time increases, deformation generated to one substrate before bonding is removed by thermal transfer between the substrates and the difference in magnifications increases.

On the other hand, because along with the passage of time, the amount of heat transferred from one of the mutually contacting two substrates 211, 213 to the other substrate increases, as the waiting time lasting until discontinuation of holding of the substrate 211 increases, a non-linear misalignment amount after the substrates 211, 213 is bonded also increases. Accordingly, in terms of the magnification correction and suppression of non-linear misalignment amounts by means of a temperature difference, the waiting time lasting until discontinuation of holding of the substrate 211 is considered to be preferably shorter. In addition, because the larger the temperature difference set for the two substrates 211, 213 is, the quicker the thermal transfer therebetween is, preferably the larger the amount of correction is, the shorter the waiting time is, and preferably the higher the correction accuracy is, the shorter the waiting time is.

However, if holding of one of the substrates, the substrate 211, is discontinued before a bonding starting point 219 is formed at Step S107 (please see FIG. 3), that is, before it is made sure that there is a predetermined coupling force between the two substrates 211, 213, positional misalignment is generated between the substrates 211, 213 in the course of bonding. Accordingly, in terms of formation of the starting point 219, it is necessary to make sure that waiting time lasts until a predetermined coupling force is generated. As a result, if the substrates 211, 213 are bonded, preferably one of the substrates, the substrate 211, is released and enlargement of the contact regions starts after the starting point 219 is formed between the substrates 211, 213 and before the temperature difference between the substrates 211, 213 becomes smaller than a predetermined threshold, that is, before a misalignment amount between the substrates 211, 213 including the difference in the magnification and a non-linear misalignment amount become equal to or larger than thresholds due to deformation being generated to at least one of the substrates 211, 213.

The above-mentioned threshold of misalignment amounts at the start of enlargement of the contact regions is a misalignment amount that enables electrical conduction between the substrates 211, 213 when mutual bonding of the substrates 211, 213 is completed, and is a misalignment amount with which structures such as respective connection portions of the substrates 211, 213 contact at least partially if those structures are provided. If positional misalignment between the substrates 211, 213 becomes equal to or larger than the threshold, connection portions do not contact each other, appropriate electrical conduction cannot be attained therebetween or a predetermined joining strength cannot be attained between joining portions. In other words, the threshold is the highest value, that is, the tolerated value, of a tolerated range of positional misalignment that is tolerated to be observed when bonding of the substrates 211, 213 is completed, and for example is predetermined for each type of the substrates 211, 213, each joining process and each substrate bonding apparatus 100. For example, by setting a temperature difference between the substrates 211, 213 at a low temperature which is 4° C., and by reducing the average magnification, a non-linear misalignment amount can be made small with waiting time of one second.

Waiting time that is long enough to form a bonding starting point 219 between the substrates 211, 213 to be bonded may be preliminarily measured or calculated, the temperature difference between the substrates 211, 213 that is to decrease during the waiting time may be estimated, and the temperature difference to be observed at the moment of starting bonding of the substrates 211, 213 may be set to be larger than a target temperature difference that is required for correction of the amount of misalignment between the two substrates 211, 213. In this case, the temperature difference initially set for the substrates 211, 213 may be, for example, determined so as to be a temperature difference that compensates the magnifications of the substrates 211, 213 at the moment when Step S109 starts after the passage of the waiting time. In this case, enlargement of the contact region preferably starts before the temperature difference falls below a predetermined range including the target temperature difference due to contact between the substrates 211, 213.

In addition, in terms of the magnification correction by means of a temperature difference between the substrates 211, 213, the temperature difference may be preliminarily set higher so that the temperature difference between the substrates 211, 213 becomes a difference in a predetermined range at the moment when bonding of the substrates 211, 213 is completed, that is, at the moment when enlargement of the contact regions from the starting point 219 formed between the substrates 211, 213 has ended. The predetermined range is set according to the above-mentioned tolerated range of amounts of positional misalignment between the two substrates 211, 213, and if a temperature difference becomes a difference out of the predetermined range, the connection portions of the substrates 211, 213 do not contact each other or appropriate electrical connection cannot be attained, or a predetermined joining strength cannot be attained between joining portions. The temperature difference to be set and the timing at which holding of one substrate is discontinued are set taking into consideration the amount of change in temperature caused by thermal transfer between the substrates 211, 213 during enlargement of the contact regions as mentioned below.

Figure 15:
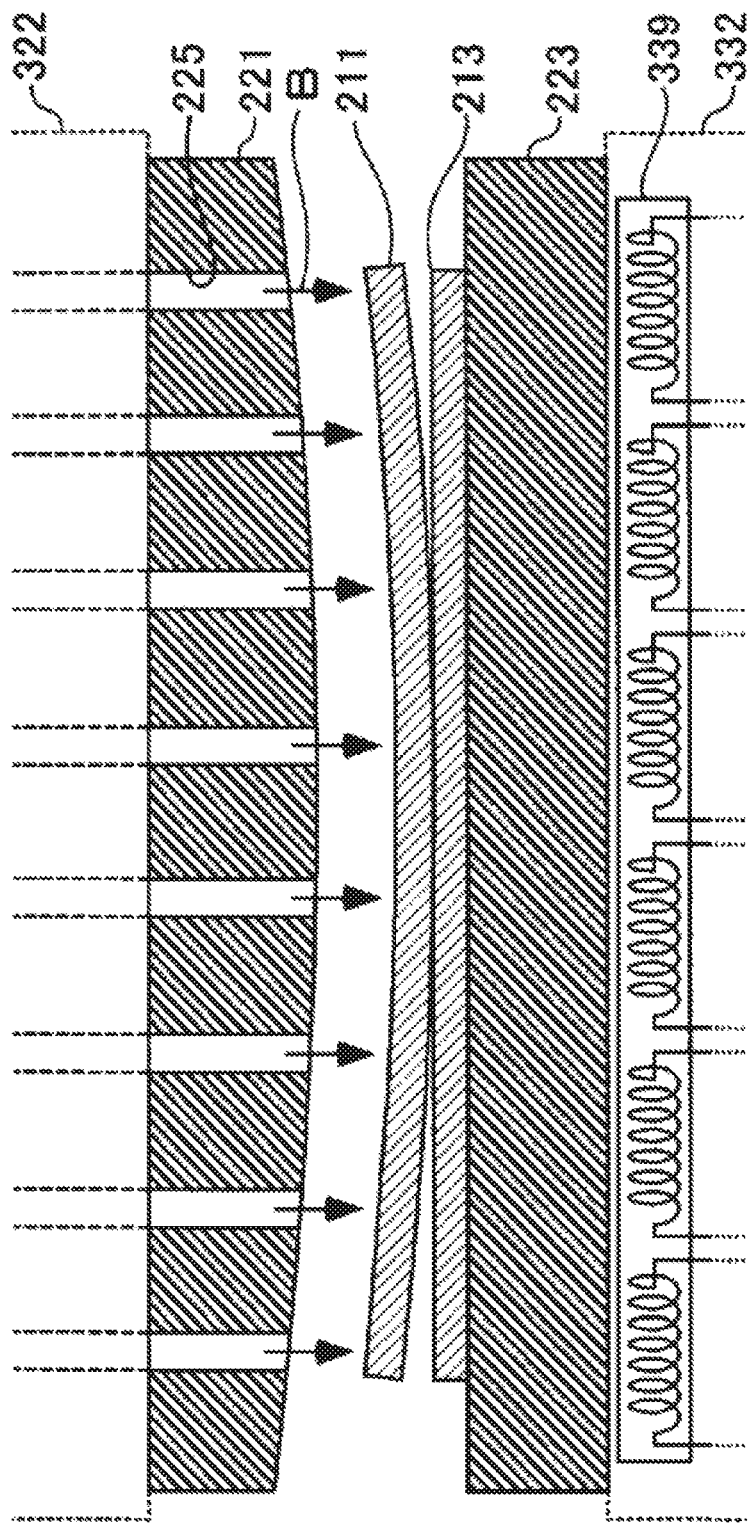
FIG. 15 is a schematic view showing a method of temperature adjustment in the bonding unit 300.

FIG. 15 is a schematic view showing one example of a temperature adjusting unit to adjust temperatures of the substrates 211, 213 in the bonding unit 300. As mentioned above, thermal transfer is generated because of contact between the two substrates 211, 213 at the time of starting point formation, and the temperature difference between the substrates 211, 213 becomes smaller than a set temperature difference. This phenomenon is generated likewise also in the course of enlargement of the contact regions of the substrates 211, 213. Because of this, the temperature adjusting unit controls exchange of heat between at least one of the substrates 211, 213 between which a temperature difference is generated and the outside in a period starting when the substrates 211, 213 contact each other and terminating when bonding is completed, and the temperature adjusting unit keeps the temperature difference between the substrates 211, 213 within a predetermined range. The outside includes the other substrate, the atmospheric gas of the substrates 211, 213, and the like.

In the example shown in FIG. 15, the temperature adjusting unit has a plurality of heaters 339 built in the lower stage 332. The plurality of heaters 339 are provided, being divided in the directions of enlargement of the contact regions, that is, in the radial directions of the lower stage 332, and the heat generation amounts thereof are adjusted individually by the control unit 150. The plurality of heaters 339 heat a substrate holder 223 holding the substrate 213 and adjusts the temperature of it to adjust the temperature of the substrate 213 held by the substrate holder 223 on a region-by-region basis, each region corresponding to each of the plurality of heaters 339.

Figure 26:
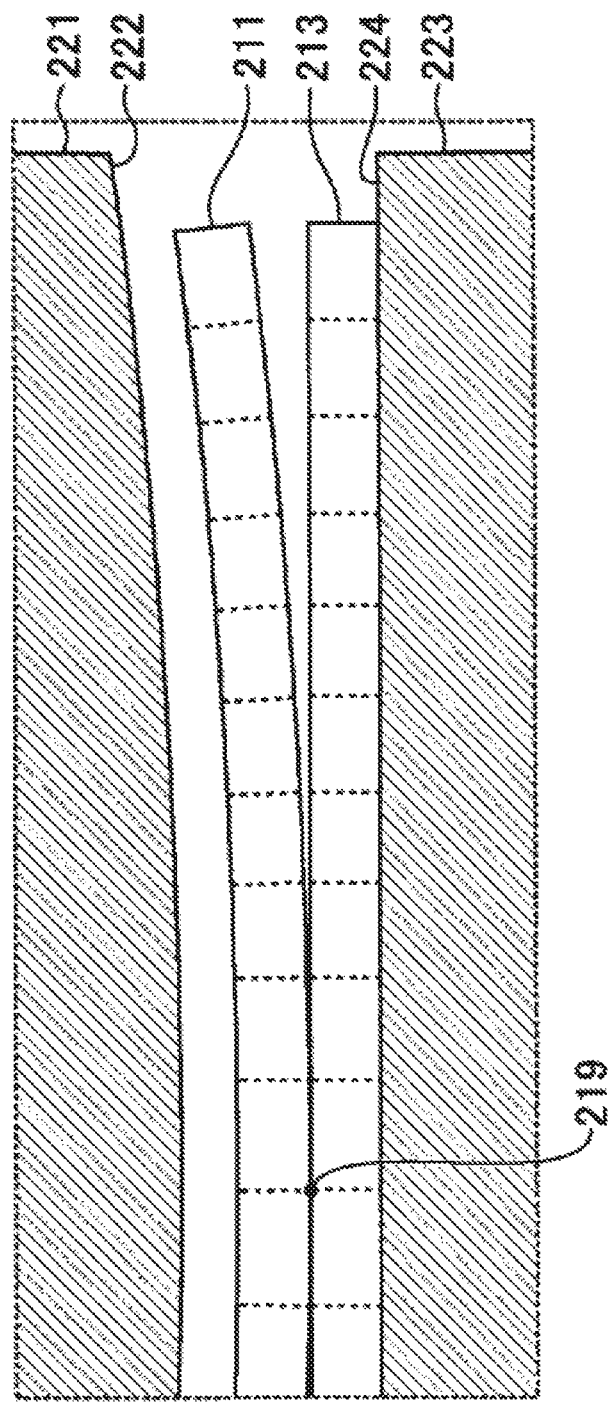
FIG. 26 is a schematic view showing the state of the substrates 211, 213 in the course of bonding.
Figure 27:
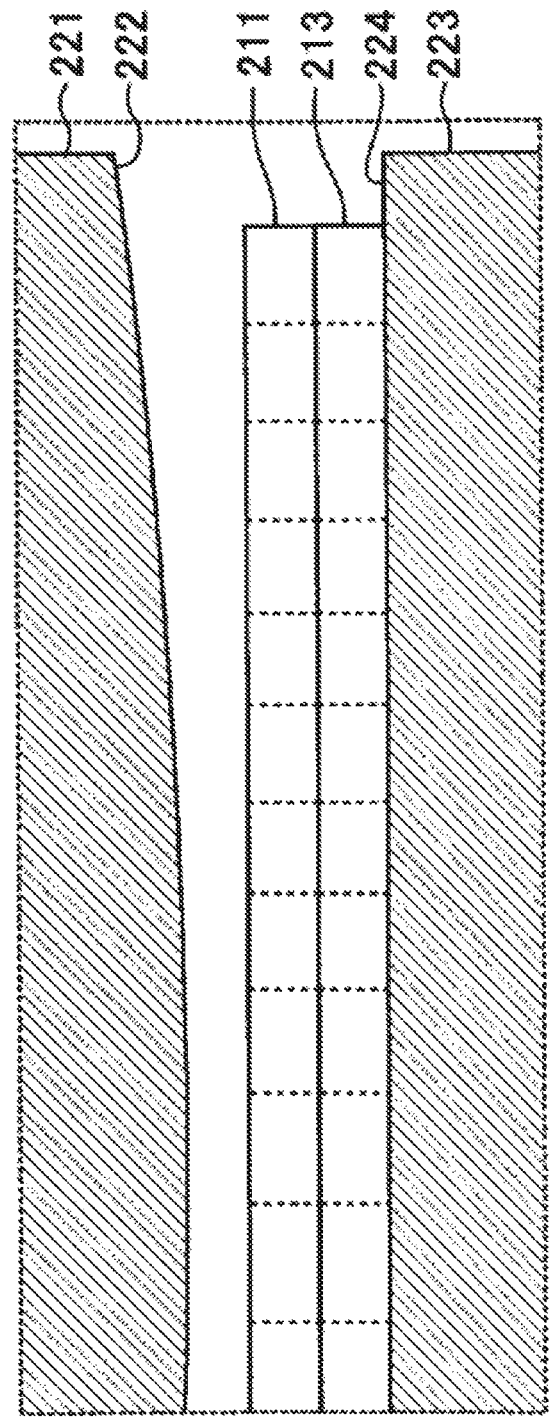
FIG. 27 is a schematic view showing the state of substrates 211, 213 in the course of bonding.

When adjusting the temperature of substrate 213, holding of the substrate 213 against the substrate holder 223 is temporarily discontinued, the substrate 213 is deformed by means of temperature adjustment, and then the substrate 213 is caused to be held by the substrate holder 223 again as shown in FIG. 26. Thereby, the distortion amount including a magnification of the substrate 213 can be coordinated according to the amount of distortion of the substrate 211 to fabricate a bonded substrate 230 with suppressed positional misalignment as shown in FIG. 27. Other than resistance heating heaters, the heaters 339 that may also be used include other heating apparatuses such as Peltier effect elements, induction heating apparatuses, infrared irradiation apparatuses or the like.

In the course of enlargement of the contact regions of the two substrates 211, 213, the control unit 150 sequentially coordinates temperatures of the heaters 339 corresponding to the moving position of the boundary between the contact regions and non-contact regions, that is, positions at which the substrates 211, 213 contact and thermal transfer occurs, according to the positions. The temperatures of the heaters 339 are set such that an amount of the temperature of the substrate 213 that is lowered due to at least thermal transfer is cancelled out, and the temperature difference between the two substrates 211, 213 is kept within a predetermined range.

Specifically, because heat present at portions that constitute the non-contact region of the substrate 213 and are adjacent to the boundary is transferred through the substrate 213 and is transferred from the contact region of the substrate 213 to the substrate 211, heaters 339 corresponding to the portions are controlled such that the temperature difference between the portions and portions of the substrate 211 corresponding to the portions of the substrate 213 becomes a temperature difference in a preset predetermined range. Along with the movement of the boundary, control on the plurality of heaters 339 is performed sequentially from the center of the substrate 213 towards its circumferential portions, Thereby, the temperature difference between mutually corresponding portions of the non-contact regions of the substrates 211, 213 is kept in a predetermined range until those portions contact each other. In other words, it is possible to suppress the temperature difference between mutually corresponding portions of the non-contact regions becoming a temperature difference out of a predetermined range due to thermal exchange at the time of mutual contact between the contact regions. A detecting unit to detect the position of the boundary between the contact regions and the non-contact regions may be provided, and heaters 339 that should be controlled may be determined based on a result of detection by the detecting unit.

If the force to hold the substrate 213 against the substrate holder 223 is larger than the thermal deformation three of the substrate 213 due to a temperature drop, control of the heater 339 corresponding to positional changes of the boundary of the contact regions can be made unnecessary.

In addition, in the illustrated example, the temperature adjusting unit has a plurality of ventilation holes 225 formed in the substrate holder 221 held by the upper stage 322. The ventilation holes 225 of the substrate holder 221 communicate with air supply holes provided to the upper stage 322. The temperature adjusting unit injects and blows gas toward the substrate 211 when or after holding of the substrate 211 is discontinued. At this time, according to the moving position of the boundary between the contact regions and the non-contact regions, gas is injected from a ventilation hole 225 corresponding to the position to the substrate 211.

In addition, the temperature adjusting unit adjusts the temperature of the gas jetted through the ventilation holes 225. As in the illustrated example, because if the substrate 213 is deformed by heating using the amount of distortion of the substrate 211 as the reference, the substrate 211 is deformed due to thermal transfer from the substrate 213, the temperature of the gas is set to a temperature that suppresses misalignment generated between the substrates 211, 213 due to the deformation.

Specifically, because heat transferred from the substrate 213 through the contact regions to the substrate 211 is transferred through the substrate 211 and transferred to portions of the non-contact region of the substrate 211 adjacent to the boundary, the temperature of the gas from ventilation holes 225 corresponding to the portions are controlled such that the temperature difference between the portions and portions of the substrate 213 corresponding to the portions of the substrate 211 becomes a temperature difference in a preset predetermined range.

The state illustrated in the figure shows the state immediately after Step S109 in FIG. 3, and the substrates 211, 213 are bonded at their middle portions, but not bonded yet at their circumferences. In this state, by adjusting the temperature of the gas injected from the ventilation hole 225 toward the substrate 211 which is located on the upper side in the figure, bonding of the substrates 211, 213 can be caused to proceed while proactively adjusting the temperature of the substrate 211 after discontinuation of holding.

By means of such temperature adjustment performed by the temperature adjusting unit, changes in the temperature of the non-contact regions that are yet to contact due to thermal exchange at the contact regions is suppressed in at least one of the two substrates 211, 213.

In the above-mentioned example, if the amounts of correction are different among regions of the substrate 211, at least one of the temperature of the gas injected from ventilation holes 225 corresponding to the respective regions and the temperatures of heaters 339 corresponding to the respective regions may be set to temperatures corresponding to amounts of correction for the regions.

In addition, the temperatures of the substrates 211, 213 that change in the course of starting point formation and in the course of enlargement of the contact regions may be detected or predicted in real time based on a result of detection by a detecting unit such as a temperature sensor like an infrared temperature sensor, for example, the temperature of the injected gas and the temperatures of the heaters 339 may be coordinated based on the detected or predicted temperatures.

In addition, although in the above-mentioned example shown, the temperatures of the heaters 339 and gas are sequentially coordinated according to the progress of enlargement of the contact regions, instead of this or in addition to this, the temperatures of the heaters 339 and gas may be set by the following method.

Before the substrates 211, 213 are brought into contact with each other, temperature changes of the substrates 211, 213 generated in the course of bonding are predicted, and the temperature of each of the plurality of heaters 339 and the temperature of the gas injected from each of the plurality of ventilation holes 225 are set based on the temperature changes. In this case, taking into consideration, for example, the degrees of activity of surfaces of the substrates 211, 213, a length of time after the substrates 211, 213 contact each other and until bonding is completed, the speed of enlargement of the contact regions, that is, the speed of advancement of the boundary, the thicknesses of the substrates 211, 213, speeds of thermal transfer through the substrates 211, 213 or the like, temperature changes of the substrates 211, 213 are predicted.

Alternatively, substrates manufactured under conditions which are the same as those for the two substrates 211, 213 to be bonded are bonded preliminarily experimentally, and based on the results, the relationship among temperatures of the heaters 339 or gas, deformation amounts of the substrates 211, 213 and temperature differences between the substrates 211, 213 is stored, and temperatures of the heaters 339 and gas are set based on the relationship.

Although in the example of FIG. 15 shown, the temperature of the substrate 213 is adjusted using an amount of distortion of the substrate 211 holding of which is discontinued at the time of bonding as a reference, the temperature of the substrate 211 may be adjusted using an amount of distortion of the substrate 213 as a reference. In this case also, the control unit 150 controls at least one of the heaters 339 and jetting of the gas such that a temperature difference between the substrates 211, 213 is maintained in a predetermined range after the substrates 211, 213 contact each other and until bonding is completed.

In this manner, the bonding unit 300 has an individual temperature adjusting device for each of the substrates 211, 213, and individually adjusts the temperatures of the substrates 211, 213; as a result, even after holding by the upper stage 322 is released, it can proactively adjust the temperature of the substrate 211. Accordingly, even after the substrate 211 is released, a temperature difference between the substrates 211, 213 can be maintained.

Although in the example shown in FIG. 15, a temperature difference between the substrates 211, 213 is maintained in the course of starting point formation and in the course of bonding, instead of this or in addition to this, it is possible to suppress a temperature difference between the substrates 211, 213 becoming smaller than a set temperature difference by the following method.

It is attempted to shorten a length of time required for starting point formation between the two substrates 211, 213 and improve the speed of enlargement of the contact regions, and before at least one of the substrates 211, 213 is deformed due to thermal transfer between the substrates 211, 213, the substrates 211, 213 are joined with each other. In this case, the degrees of activity of surfaces the substrates 211, 213 are changed in order to improve the force of chemical bonds such as hydrogen bonds between the substrates 211, 213.

The two substrates 211, 213 may be joined in a reduced-pressure atmosphere. Thereby, thermal transfer via a gas between the two substrates 211, 213 is suppressed. In this case, the pressure in the bonding unit 300 may be reduced preliminarily, or only in the course of bonding starting at the stage of starting starting point formation and ending at completion of bonding, the pressure in the bonding unit 300 or only the space around the substrates 211, 213 may be reduced.

The temperature around at least one of the two substrates 211, 213 that has an adjusted temperature may be controlled such that a difference of it from the temperature of the substrate becomes a difference in a predetermined range. The predetermined range is set according to a tolerated range of the amount of misalignment between the two substrates 211, 213. For example, if the substrate 211 is corrected by means of temperature adjustment, the temperature between the substrate holder 221 and the substrate 213 is controlled such that the difference of it from the temperature of the substrate 211 becomes a difference in a predetermined range.

Figure 16:
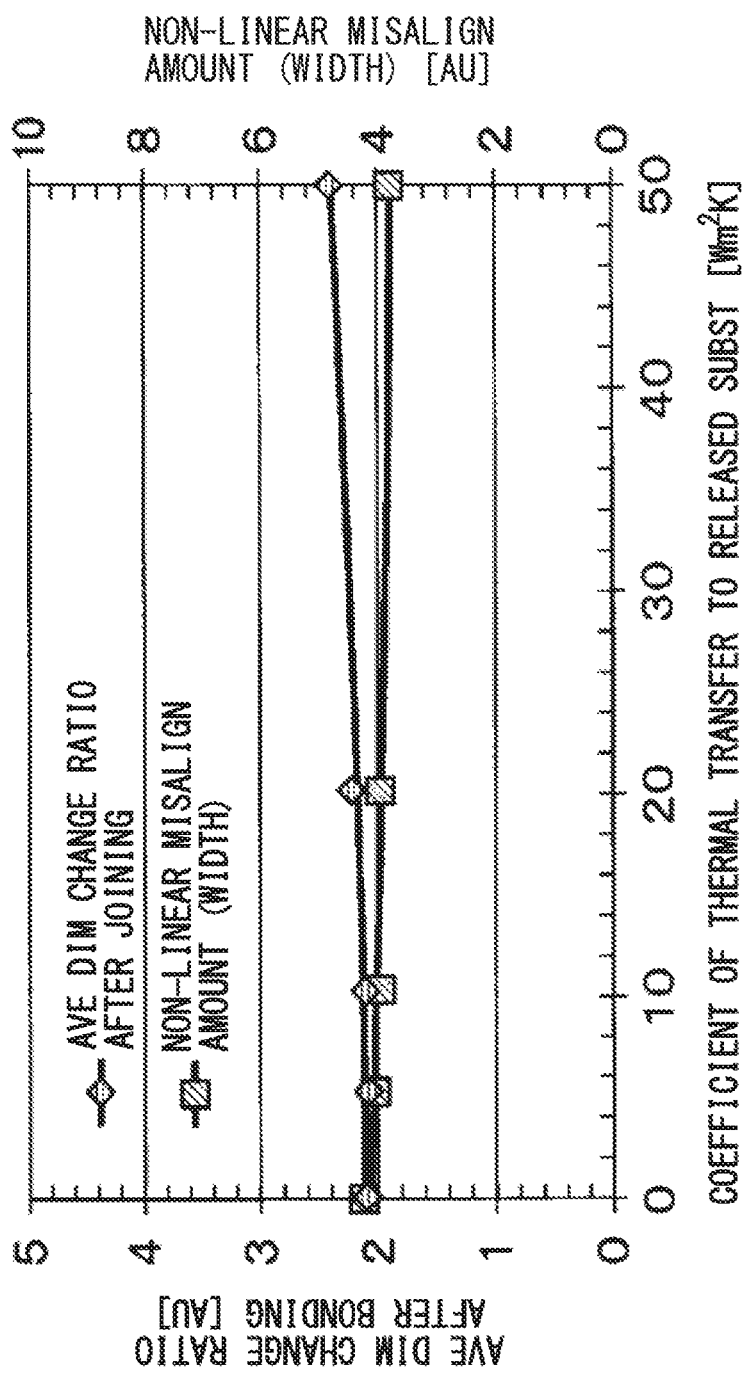
FIG. 16 is a graph showing distributions of misalignment amounts and magnifications of bonded substrates 230.

FIG. 16 is a graph showing distributions of misalignment amounts and magnifications of bonded substrates 230. FIG. 16 shows distributions of misalignment amounts and magnifications in bonded substrates 230 in a case where even after substrates 211 that are initially held by the upper stage 322 are released from holding by the substrate holder 221, adjustment of their temperatures is continued using the ventilation holes 225 until completion of bonding. In bonding of the substrates 211, 213, temperature adjustment is performed such that at middle portions of substrates 211, 213, the temperature of the substrate 213 on the lower stage 332 side becomes higher by 5° C. than the temperature of the substrate 211 on the upper stage 322 side.

The horizontal axis of the graph shown in FIG. 16 indicates the coefficient of thermal transfer from the substrate holder 221 to released substrates 211. In addition, the vertical axis of the graph indicates, similar to FIG. 14, average magnifications after bonding and non-linear misalignment amounts in bonded substrates 230.

As illustrated in the figure, magnification correction by means of adjustment of the temperature of substrates 211 is maintained by continuing proactive temperature adjustment even after the substrates 211 are released from the substrate holder 221. Thereby, non-linear misalignment amounts are reduced also in bonded substrates 230 obtained after bonding.

In this manner, the bonding unit 300 may be provided with a temperature adjusting unit to actively adjust the temperature of at least one of substrates 211, 213 during waiting time from Step S107 (please see FIG. 3) to Step S109 (please see FIG. 3) and in the course of bonding. This temperature adjusting unit continues heating or cooling of at least one of the substrates 211, 213 also during the waiting time so as to maintain a temperature difference that attains a predetermined amount of correction until Step S109 (please see FIG. 3) is executed. Thereby, bonding of the substrates 211, 213 proceeds in a state where the temperature difference between the substrates 211, 213 is maintained, and the substrates 211, 213 can be bonded in an accurately positioned state.

Figure 17:
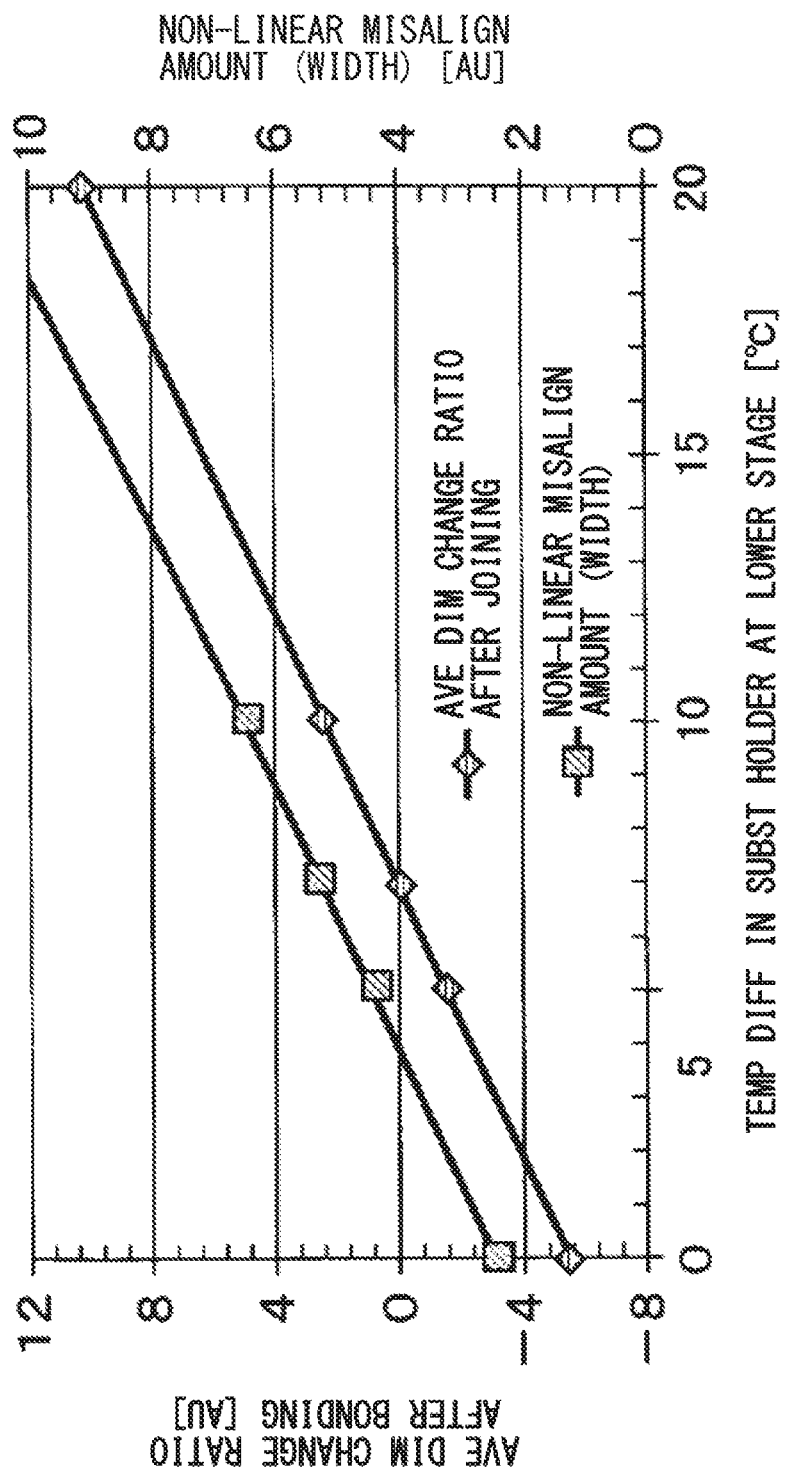
FIG. 17 is a graph showing distributions of misalignment amounts and magnifications of bonded substrates 230.

FIG. 17 is a graph showing distributions of misalignment amounts and magnifications of bonded substrates 230. FIG. 17 shows distributions of misalignment amounts and magnifications in bonded substrates 230 in a case where bonding is performed while a temperature gradient in the radial directions is generated to substrates 213 on the lower side in the figure by adjusting the temperature using the heater 339 of the lower stage 332 shown in FIG. 15.

Here, the temperature gradient generated to the substrate 213 is set such that the temperature on the circumferential side of the substrates 213 becomes higher than the temperature at middle portions of the substrates 213.

Thereby, even if the temperature of a substrate 211 rises because heat is transferred from the substrate 211 to be bonded to a substrate 213 to the substrate 213 while bonding of the substrates 211, 213 proceeds, a temperature difference between substrates 211, 213 is maintained until regions in which the substrates 211, 213 are bonded expand to the circumferences of the substrates. Accordingly, the magnification correction by means of a temperature difference becomes effective in bonding of the entire substrates 211, 213.

FIG. 15 shows the heater 339 of the lower stage 332 and the ventilation holes 225 of the substrate holder 221 held by the upper stage 322 together. But even if only either the heater 339 or the ventilation holes 225 is or are present, positional misalignment in bonded substrates 230 can be suppressed. In addition, if the temperature of at least one of the substrates 211, 213 is adjusted, another temperature adjusting device other than the heater 339 and the ventilation holes 225 may also be used. In addition, not only a heating apparatus but a cooling apparatus may also be used as a temperature adjusting device.

FIGS. 18, 19, 20, and 21 are graphs showing actually measured amounts of misalignment and expected amounts of misalignment between substrates 211, 213 in bonded substrates 230 fabricated while changing conditions of bonding of the substrates 211, 213, and their average magnifications. The expected misalignment amounts represent differences in magnifications between the substrates 211, 213. The average magnifications are actually measured average magnifications, and unlike the average magnifications shown in FIG. 14 to FIG. 17, are actually measured misalignment amounts divided by the value of radiuses. The misalignment amounts and magnifications are shown as distributions in a radial direction of bonded substrates 230.

Figure 18:
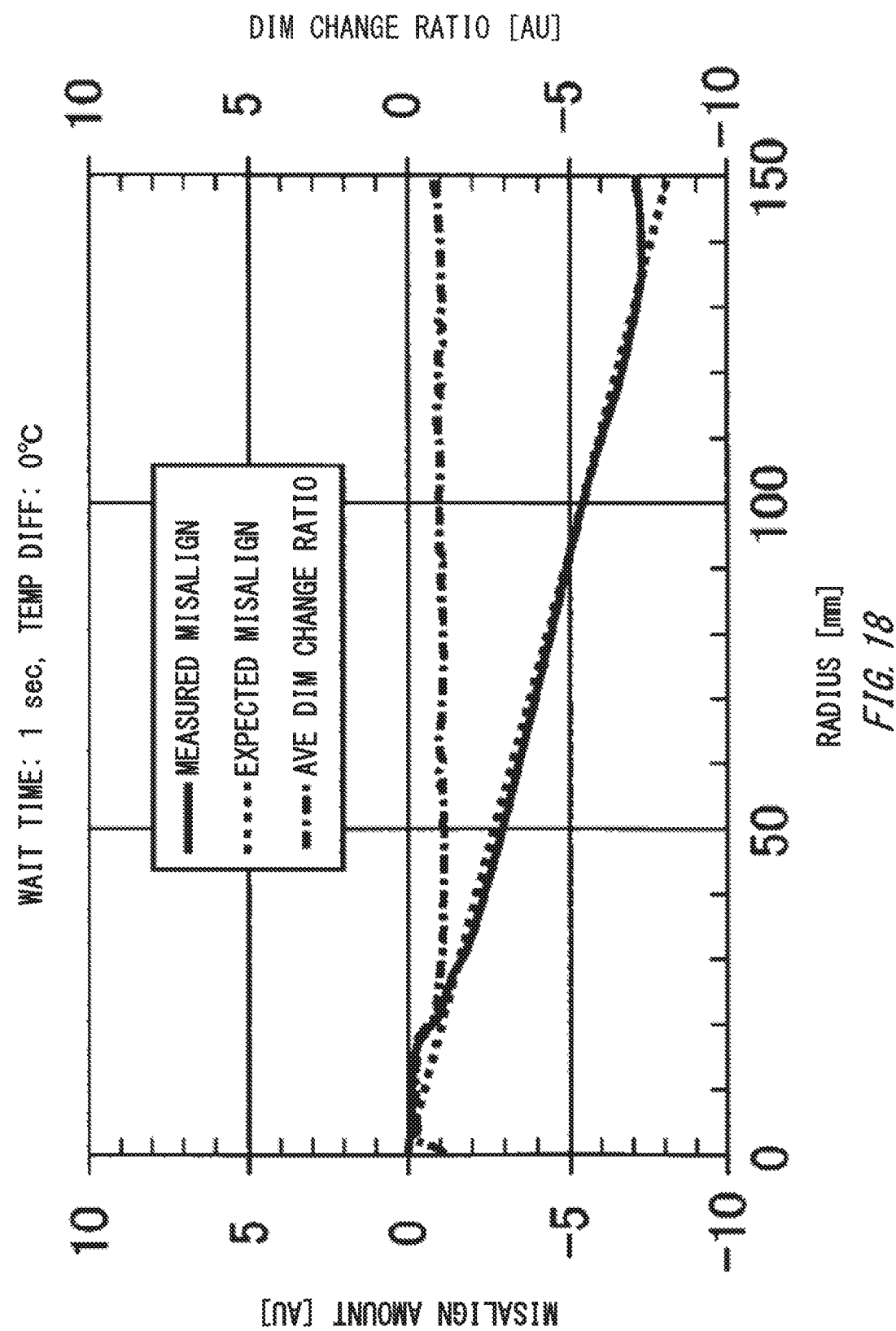
FIG. 18 is a graph showing distributions of misalignment amounts and magnifications of bonded substrates 230.

A bonded substrate 230 that exhibits the distributions of the misalignment amounts and magnifications shown in FIG. 18 was fabricated by bonding substrates 211, 213 between which a temperature difference was not set (temperature difference: 0° C.). Waiting time starting when the substrates 211, 213 contact each other and ending when holding of one of the substrates, the substrate 211, was discontinued when the substrates 211, 213 were bonded in the bonding unit 300 was set to one second. In this bonded substrate 230, as the distances from the circumferences of the substrates 211, 213 decrease, the actually measured misalignment amount increases in approximately the same manner as the expected misalignment amount due to the difference in magnifications that the substrates 211, 213 had before bonding. But the actually measured average magnifications of the bonded substrate 230 are stable regardless of positions in the radial direction.

Figure 19:
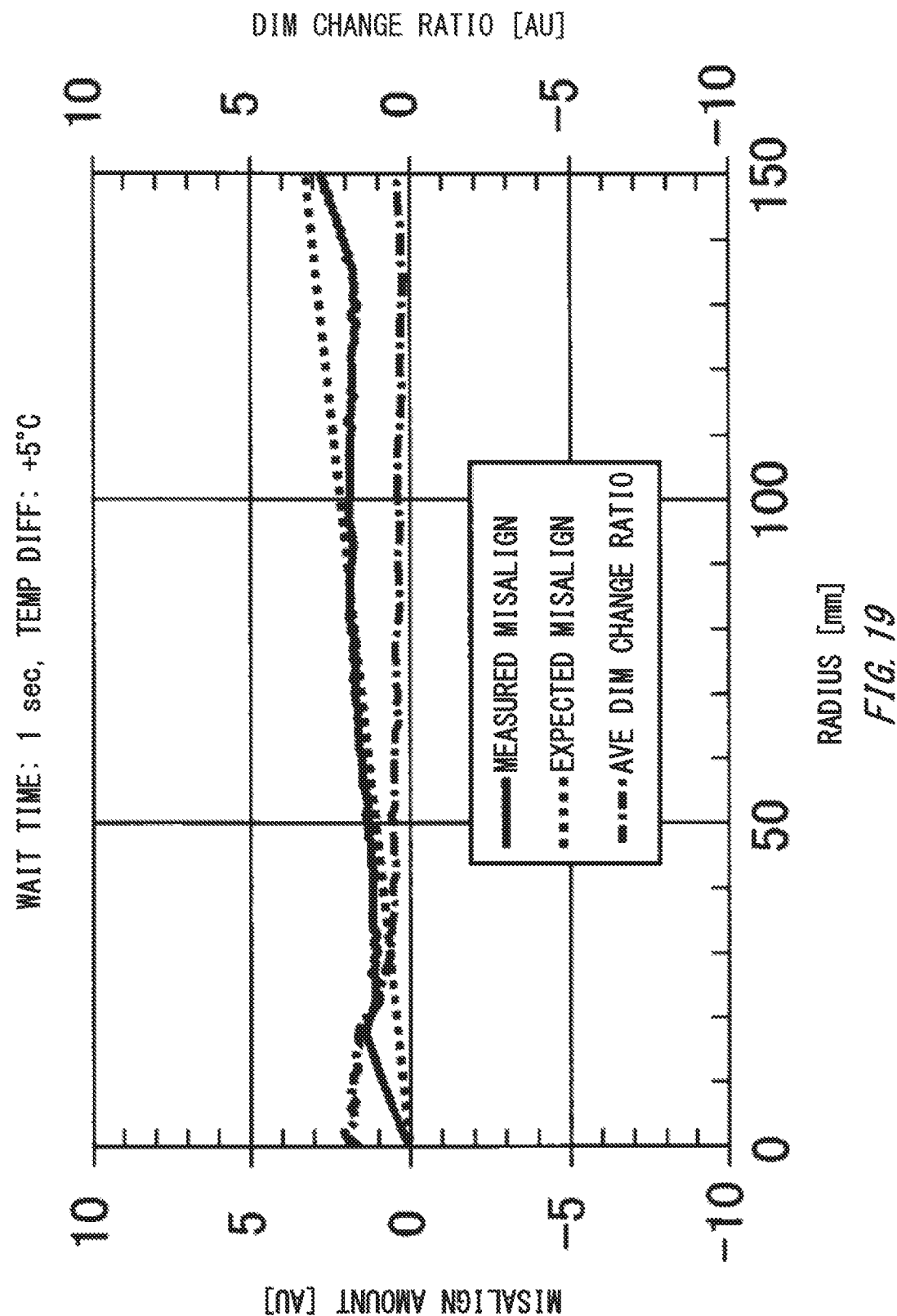
FIG. 19 is a graph showing distributions of misalignment amounts and magnifications of bonded substrates 230.

A bonded substrate 230 that exhibits the distributions of the misalignment amounts and magnifications shown in FIG. 19 was fabricated by bonding substrates 211, 213 between which a temperature difference of 5° C. was set (temperature difference: 5° C.) with the waiting time being set to one second. In this bonded substrate 230, the actually measured misalignment amount due to a difference in magnifications between the substrates 211, 213 is suppressed generally corresponding to the expected misalignment amount because a temperature difference was generated between the substrates 211, 213. However, at a middle portion of the bonded substrate 230 and circumferential portions of the bonded substrate 230, there are differences of the actually measured misalignment amount from the expected misalignment amount showing a linear magnification component. That is, there is non-linear component distortion generated to the middle portion and circumferential portions. However, actually measured average magnifications have small absolute values except for regions around the middle of the bonded substrate 230.

Figure 20:
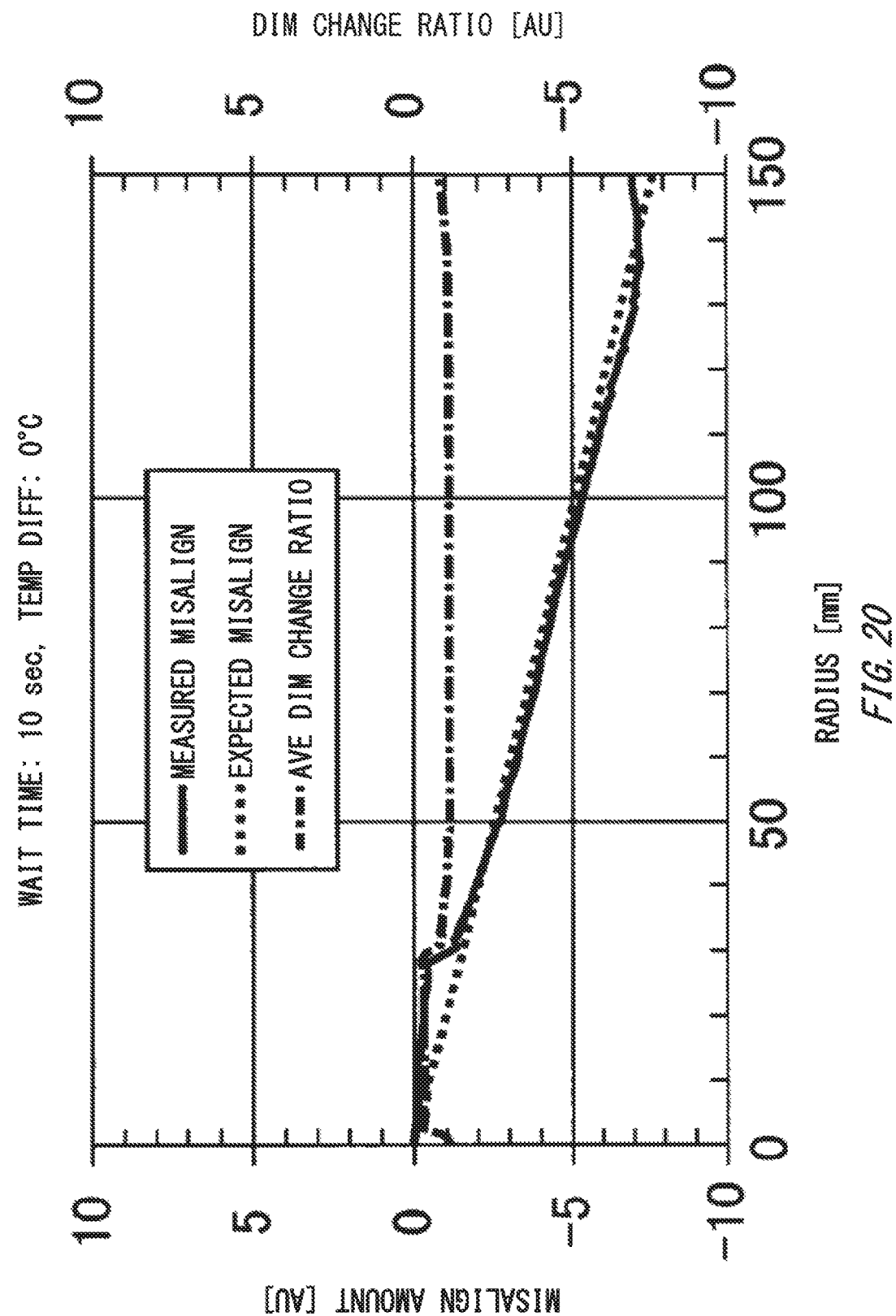
FIG. 20 is a graph showing distributions of misalignment amounts and magnifications of bonded substrates 230.

A bonded substrate 230 that exhibits the distributions of the misalignment amounts and magnifications shown in FIG. 20 was fabricated by bonding substrates 211, 213 between which a temperature difference was not set (temperature difference: 0° C.). Waiting time starting when the substrates 211, 213 contact each other and ending when holding of one of the substrates, the substrate 211, was discontinued when the substrates 211, 213 were bonded in the bonding unit 300 was set to ten seconds. Accordingly, at the moment when one of the substrates 211, 213 was released, regions that were already bonded were formed at middle portions pressed against each other between the substrates 211, 213. But because a temperature difference was not generated between the substrates 211, 213 and magnifications were not corrected, the distribution of misalignment amounts in the radial directions shows tendency which is the same as that in the example shown in FIG. 18, except for that misalignment amounts in regions near the middle are enlarging according to the length of waiting time.

Figure 21:
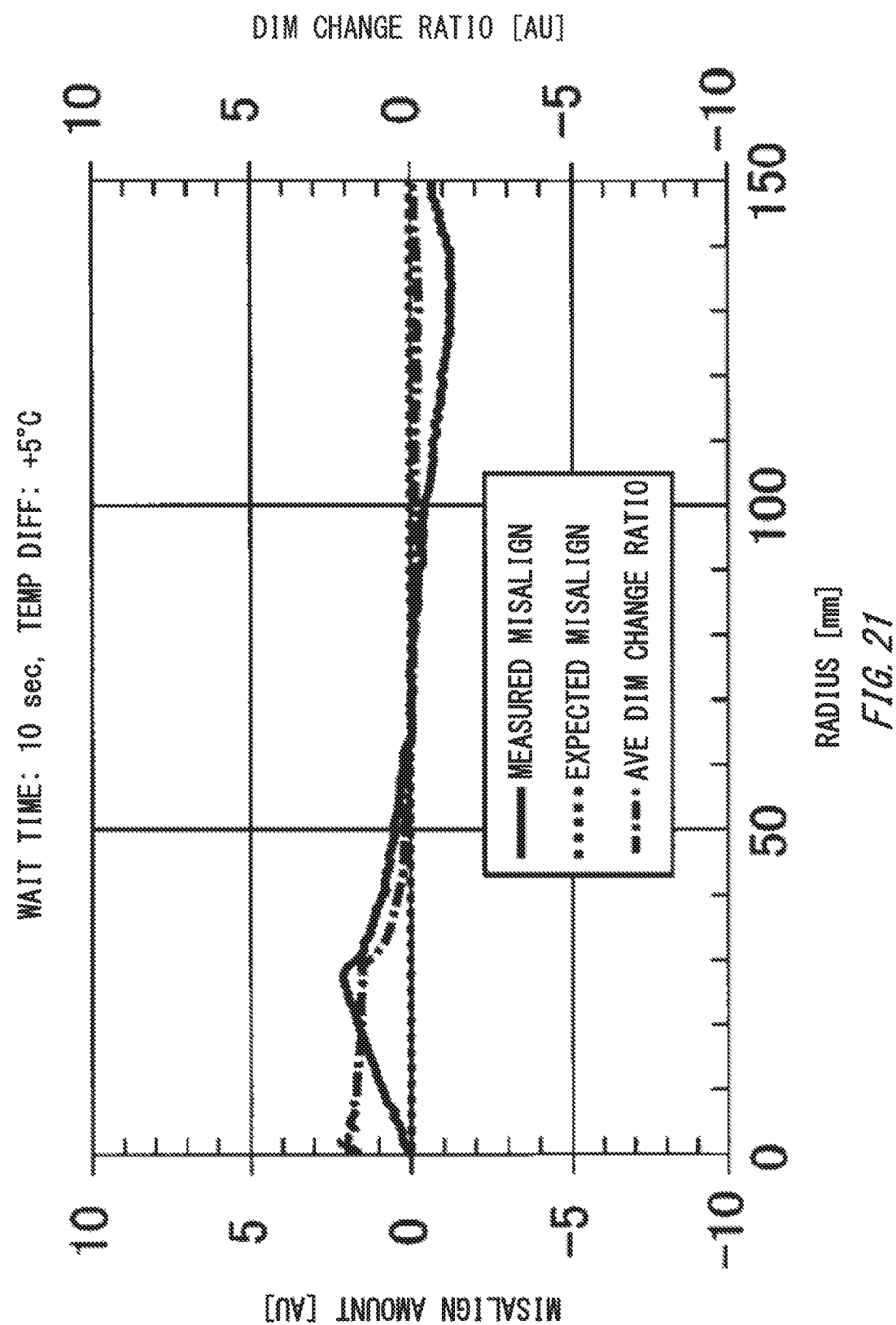
FIG. 21 is a graph showing distributions of misalignment amounts and magnifications of bonded substrates 230.

A bonded substrate 230 that exhibits the distributions of the misalignment amounts and magnifications shown in FIG. 21 was fabricated by bonding substrates 211, 213 between which a temperature difference of 5° C. was set (temperature difference: 5° C.) with the waiting time being set to ten seconds. Accordingly, also in fabricating this bonded substrate 230, at the moment when one of the substrates 211, 213 was released, regions that were already bonded were formed at middle portions pressed against each other between the substrates 211, 213.

In the example of FIG. 21, there are differences of the actually measured misalignment amounts from the expected misalignment amounts at a middle portion of the bonded substrate 230 and circumferential portions of the bonded substrate 230, and in particular at the middle portion, the difference is larger than that in the example of FIG. 19. Because of this, as mentioned in the example shown in FIG. 14, it is better to further shorten waiting time.

Other than bonding of substrates 211, 213 using silicon single-crystal substrates, the substrate bonding apparatus 100 as mentioned above may be used for bonding of SiO$_2$ surfaces disposed on surfaces of the substrates 211, 213. In addition, the substrate bonding apparatus 100 may also be used when bonding Cu bumps disposed discretely on bonding surfaces of the substrates 211, 213.

In addition, although in the above-mentioned example shown, enlargement of contact regions starts upon releasing of at least one of the substrates 211, 213 from the substrate holder 221 or substrate holder 223, instead of this, contact regions may be enlarged in a state where both the substrates 211, 213 are being held. In this case, for example, a plurality of actuators are arranged along the plane directions of at least one of the substrates 211, 213, an actuator corresponding to the centers of the substrates 211, 213 is driven to form a starting point 219, and then a plurality of actuators are controlled to press one substrate against the other substrate sequentially starting from central portions toward circumferential portions; thereby, the progress of contact of the one substrate with the other substrate, that is, the progress of enlargement of contact regions can be controlled.

In addition, although in the above-mentioned example shown, the temperatures of the entire substrates 211, 213 are adjusted, the temperature of only a surface on which a circuit region is formed of at least one of the substrates 211, 213 may be adjusted, and in addition the temperature of not the entire substrates 211, 213 but only portions where positional misalignment is being generated between the substrates 211, 213 may be adjusted.

If the temperature of only a surface is adjusted, the substrate bends due to stretching/shrinking deformation of the surface, but when this substrate is held on a stage or substrate holder, the substrate can be caused to conform to the shapes of the holding surfaces of the stage and the substrate holder due to the suctional attraction forces thereof.

If the temperatures of only portions at which positional misalignment is being generated are adjusted, a temperature difference is generated between the portions of the substrates 211, 213. In this case, a temperature adjusting unit adjusts the temperatures of the substrates 211, 213 such that in the course of enlargement of the contact regions, thermal exchange caused by contact between the portions suppresses changes in the temperature of each of non-contact regions adjacent to the portions or a temperature difference between non-contact regions. If a temperature difference is not actively generated between non-contact regions, the temperature of non-contact regions of each of the substrates 211, 213 is maintained in a predetermined range using the same temperature as a reference. In addition, "bonded" in the present example refers to states where terminals provided to two substrates stacked in a method described in the present example are connected to each other, and thereby it is ensured that electrical conduction is established between the two substrates or a strength of joining between the two substrates becomes equal to or higher than a predetermined strength, if these are the cases. In addition, if two substrates stacked in a method described in the present example are thereafter subjected to processes such as annealing, and thereby the two substrates are finally electrically connected or a strength of joining between the two substrates becomes equal to or higher than a predetermined strength, "bonded" refers to states where the two substrates are temporarily coupled, that is, tentatively joined before the processes such as annealing.

The state where a strength of joining becomes equal to or higher than a predetermined strength by annealing includes, for example, a state where surfaces of two substrates are coupled by covalent bonds. In addition, the state where substrates are tentatively joined includes a state where two substrates lying one on another can be separated and reused. In addition, although in the present example shown, enlargement of contact regions starts before positional misalignment which is equal to or larger than a threshold is generated between the substrates 211, 213, instead of this, enlargement of contact regions may start before deformation which is equal to or larger than a threshold is generated to at least one of the substrates 211, 213. In this case, if only one substrate is deformed, the threshold is set such that the magnitude of a deformation amount generated to the one substrate does not become large enough to generate misalignment with which appropriate electrical connection or joining strength cannot be attained between connection portions of the substrates 211, 213 using, as a reference, the state before parts of the substrates 211, 213 contact each other or the state where the substrates 211, 213 are positioned. On the other hand, if both the substrates 211, 213 deform, the threshold is set such that a difference in the deformation amounts does not become large enough to generate misalignment with which appropriate electrical connection or joining strength cannot be attained between connection portions of the substrates 211, 213.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A substrate bonding apparatus that brings a part of a surface of a first substrate and a part of a surface of a second substrate into contact to form contact regions at the parts, and then enlarges the contact regions to bond the first substrate and the second substrate, the substrate bonding apparatus comprising:
   a temperature adjusting unit that adjusts a temperature of at least one of the first substrate and the second substrate such that positional misalignment between the first substrate and the second substrate does not exceed a threshold at least in a course of enlargement of the contact regions.

2. The substrate bonding apparatus according to claim 1, wherein the temperature adjusting unit adjusts a temperature of at least one of non-contact regions of the first substrate and the second substrate such that positional misalignment which is equal to or larger than the threshold does not occur between the non-contact regions, the non-contact regions being regions in which the surface of the first substrate and the surface of the second substrate are not in contact yet.

3. The substrate bonding apparatus according to claim 2, wherein the temperature adjusting unit keeps a temperature difference between the non-contact regions within a predetermined range until the non-contact regions come into contact.

4. The substrate bonding apparatus according to claim 1, wherein the temperature adjusting unit detects a temperature of at least one of the first substrate and the second substrate in a course of enlargement of the contact regions and performs temperature adjustment based on a result of the detection.

5. The substrate bonding apparatus according to claim 1, wherein the temperature adjusting unit predicts a temperature of at least one of the first substrate and the second substrate generated in a course of enlargement of the contact regions and performs temperature adjustment based on a result of the prediction.

6. The substrate bonding apparatus according to claim 5, wherein the temperature adjusting unit predicts a temperature of at least one of the first substrate and the second substrate based on at least one of: states of bonding surfaces of the first substrate and the second substrate; a length of time after the parts come into contact and until bonding is completed; a speed of enlargement of the contact regions; a thickness of at least one of the first substrate and the second substrate; and a speed of thermal transfer through at least one of the first substrate and the second substrate.

7. The substrate bonding apparatus according to claim 1, wherein the temperature adjusting unit has a plurality of heaters that are arrayed along a direction of enlargement of the contact regions, and
   temperatures of the plurality of heaters respectively change along with enlargement of the contact regions.

8. The substrate bonding apparatus according to claim 1, wherein the temperature adjusting unit injects gas having an adjusted temperature to at least one of the first substrate and the second substrate.

9. A substrate bonding method of bringing a part of a surface of a first substrate and a part of a surface of a second substrate into contact to form contact regions at the parts, and then enlarging the contact regions to bond the first substrate and the second substrate, the substrate bonding method comprising:
   adjusting a temperature of at least one of the first substrate and the second substrate such that positional misalignment between the first substrate and the second substrate does not exceed a threshold at least in a course of enlargement of the contact regions.

10. The substrate bonding method according to claim 9, wherein in the adjusting, a temperature of at least one of non-contact regions of the first substrate and the second substrate is adjusted such that positional misalignment which is equal to or larger than the threshold does not occur between the non-contact regions, the non-contact regions being regions in which the surface of the first substrate and the surface of the second substrate are not in contact yet.

11. The substrate bonding method according to claim 10, wherein in the adjusting, a temperature difference between the non-contact regions is adjusted to be a temperature within a predetermined range when the non-contact regions come into contact.

12. The substrate bonding method according to claim 9, wherein in the adjusting, a temperature of at least one of the first substrate and the second substrate is detected in a course of enlargement of the contact regions and temperature adjustment is performed based on a result of the detection.

13. The substrate bonding method according to claim 9, wherein in the adjusting, a temperature of at least one of the first substrate and the second substrate generated in a course of enlargement of the contact regions is predicted and temperature adjustment is performed based on a result of the prediction.

14. The substrate bonding method according to claim 13, wherein in the adjusting, a temperature of at least one of the first substrate and the second substrate is predicted based on at least one of: states of bonding surfaces of the first substrate and the second substrate; a length of time after the parts come into contact and until bonding is completed; a speed of enlargement of the contact regions; a thickness of at least one of the first substrate and the second substrate; and a speed of thermal transfer through at least one of the first substrate and the second substrate.

15. The substrate bonding method according to claim 9, wherein in the adjusting, temperatures of a plurality of heaters that are arrayed along a direction of enlargement of the contact regions respectively change along with enlargement of the contact regions.

16. The substrate bonding method according to claim 9, wherein in the adjusting, gas having an adjusted temperature is injected to at least one of the first substrate and the second substrate.

* * * * *